(12) United States Patent
Bae et al.

(10) Patent No.: US 11,368,246 B2
(45) Date of Patent: Jun. 21, 2022

(54) METHOD AND DEVICE FOR TRANSMITTING OR RECEIVING BROADCAST SERVICE IN MULTIMEDIA SERVICE SYSTEM

(71) Applicant: Samsung Electronics Co., Ltd., Suwon-si (KR)

(72) Inventors: Jae-Hyeon Bae, Seoul (KR); Young-Wan So, Gunpo-si (KR); Dong-Yeon Kim, Seoul (KR); Hyun-Koo Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 16/753,197

(22) PCT Filed: Oct. 15, 2018

(86) PCT No.: PCT/KR2018/012114
§ 371 (c)(1),
(2) Date: Apr. 2, 2020

(87) PCT Pub. No.: WO2019/074341
PCT Pub. Date: Apr. 18, 2019

(65) Prior Publication Data
US 2020/0259589 A1    Aug. 13, 2020

(30) Foreign Application Priority Data

Oct. 13, 2017  (KR) .................. 10-2017-0133600
Oct. 17, 2017  (KR) .................. 10-2017-0134905

(51) Int. Cl.
*H04L 1/00* (2006.01)
*H03M 13/05* (2006.01)

(52) U.S. Cl.
CPC .......... *H04L 1/0041* (2013.01); *H03M 13/05* (2013.01); *H04L 1/0045* (2013.01); *H04L 1/0057* (2013.01)

(58) Field of Classification Search
CPC ... H04L 1/0041; H04L 1/0045; H04L 1/0057; H03M 13/05; H03M 13/35
See application file for complete search history.

(56) References Cited

U.S. PATENT DOCUMENTS

2009/0262838 A1  10/2009  Gholmieh et al.
2013/0013982 A1   1/2013  Hwang et al.
(Continued)

FOREIGN PATENT DOCUMENTS

KR       10-1197075 B1    11/2012
KR    10-2013-0006380 A    1/2013
(Continued)

*Primary Examiner* — Oussama Roudani
(74) *Attorney, Agent, or Firm* — Jefferson IP Law, LLP

(57) ABSTRACT

The present invention relates to a method and device for transmitting or receiving a broadcast service including a packet, which is generated using an application layer forward error correction (AL-FEC) scheme, in a multimedia service system. An embodiment of the present invention provides a method for transmitting a broadcast service by a transmitter, the method comprising the steps of: determining one forward error correction (FEC) scheme for a broadcast service among multiple FEC schemes; configuring a signaling message so as to include an identifier indicating the determined FEC scheme; and transmitting the configured signaling message.

17 Claims, 19 Drawing Sheets

(56) References Cited

U.S. PATENT DOCUMENTS

| | | | |
|---|---|---|---|
| 2013/0136193 A1 | 5/2013 | Hwang et al. | |
| 2014/0307734 A1* | 10/2014 | Luby | H04L 65/00 370/390 |
| 2014/0317476 A1* | 10/2014 | Hwang | H04L 1/0041 714/776 |
| 2016/0182188 A1* | 6/2016 | Hwang | H03M 13/29 375/240.27 |
| 2016/0241356 A1* | 8/2016 | Yang | H04L 1/0083 |
| 2016/0277146 A1* | 9/2016 | Hwang | H03M 13/13 |
| 2017/0155478 A1 | 6/2017 | So et al. | |
| 2018/0255029 A1 | 9/2018 | Kim et al. | |

FOREIGN PATENT DOCUMENTS

| | | |
|---|---|---|
| KR | 10-2014-0098231 A | 8/2014 |
| KR | 10-1687115 B1 | 12/2016 |
| KR | 10-1761812 B1 | 7/2017 |

\* cited by examiner

FIG.8

METHOD AND DEVICE FOR TRANSMITTING OR RECEIVING BROADCAST SERVICE IN MULTIMEDIA SERVICE SYSTEM

CROSS-REFERENCE TO RELATED APPLICATION(S)

This application is a U.S. National Stage application under 35 U.S.C. § 371 of an International application number PCT/KR2018/012114, filed on Oct. 15, 2018, which is based on and claimed priority of a Korean patent application number 10-2017-0133600, filed on Oct. 13, 2017, in the Korean Intellectual Property Office, and of a Korean patent application number 10-2017-0134905, filed on Oct. 17, 2017, in the Korean Intellectual Property Office, the disclosure of each of which is incorporated by reference herein in its entirety.

TECHNICAL FIELD

The present disclosure relates to a method and apparatus for transmitting and receiving a broadcast service including a generated packet by using an application layer forward error correction (AL-FEC) scheme in a multimedia service system.

BACKGROUND ART

As a broadcasting and communication convergence environment is provided together with ultra-high-speed wireless networks and the Internet, a converged content consumption environment has been established in which terminals having various capabilities coexist. In this context, due to increase of high-volume contents, data congestion on a network becomes worse. Thus, there is a need for schemes for supporting a receiver to recover data lost on a network.

According to application layer forward error correction (AL-FEC), which is one of such schemes, a transmitter may transmit spare information allowing the receiver to recover the lost information on the network, together with the original information, to the receiver. The spare information may be generated using an algorithm pre-agreed between the transmitter and the receiver. The algorithm may generate the spare information in the unit called a repair block by using the original information in the unit called a source block as an input, and may generate as many repair symbols constituting the repair block as needed, instead of generating the entire repair block. Additional information needed for the receiver to recover the lost information by using the algorithm may be transmitted from the transmitter to the receiver.

An AL-FEC code may indicate a relationship between a repair symbol of the repair block and a source symbol of the source block. A general AL-FEC code may generate separate repair symbols by selecting one or more source symbols from the entire source block and calculating a binary sum of the source symbols. In this case, selection of the one or more source symbols may be designed without considering separate characteristics of the source symbol. However, the original information may have different priorities and the AL-FEC code may be designed to select the one or more source symbols based on the priorities. In the original information, according to the AL-FEC algorithm, in source symbol block generation, an order of input of the source packet and an order of symbols in the source symbol block may be different from each other, and the AL-FEC code may be designed such that the order of input of the source packet and the order of symbols in the source symbol block are rearranged. In this case, an additional device and process that are not required in the general AL-FEC code may be needed for a transmitter and a receiver.

DETAILED DESCRIPTION OF THE INVENTION

Technical Problem

The present disclosure provides a method and apparatus for transmitting and receiving a broadcast service including a packet generated using an AL-FEC scheme in a multimedia service system.

The present disclosure provides a method and apparatus for transmitting and receiving a broadcast service including identification information indicating an FEC scheme used for packet encoding in a multimedia service system.

Technical Solution

According to an embodiment of the present disclosure, a method for transmitting a broadcast service by a transmitter includes determining one FEC scheme for a broadcast service among multiple FEC schemes, configuring a signaling message to include an identifier indicating the determined FEC scheme, and transmitting the configured signaling message, in which the multiple FEC schemes include an adaptive FEC scheme, and the adaptive FEC scheme is applicable to a source flow divided into one source symbol block or multiple source symbol blocks, and the one source symbol block or each of the multiple source symbol blocks divided from the source flow includes multiple source symbol sub-blocks having different priorities.

According to another embodiment of the present disclosure, a method for receiving a broadcast service by a receiver includes receiving a signaling message from a transmitter and identifying an identifier indicating one forward error correction (FEC) scheme for a broadcast service among multiple FEC schemes, the identifier being included in the signaling message, in which the multiple FEC schemes include an adaptive FEC scheme, and the adaptive FEC scheme is applicable to a source flow divided into one source symbol block or multiple source symbol blocks, and the one source symbol block or each of the multiple source symbol blocks divided from the source flow includes multiple source symbol sub-blocks having different priorities.

According to another embodiment of the present disclosure, a transmitter for transmitting a broadcast service includes a processor configured to determine one FEC scheme for a broadcast service among multiple FEC schemes, configure a signaling message to include an identifier indicating the determined FEC scheme, and transmit the configured signaling message, in which the multiple FEC schemes include an adaptive FEC scheme, and the adaptive FEC scheme is applicable to a source flow divided into one source symbol block or multiple source symbol blocks, and the one source symbol block or each of the multiple source symbol blocks divided from the source flow includes multiple source symbol sub-blocks having different priorities.

According to another embodiment of the present disclosure, a receiver for receiving a broadcast service includes a processor configured to receive a signaling message from a transmitter and identify an identifier indicating one FEC scheme for a broadcast service among multiple FEC schemes, the identifier being included in the signaling message, in which the multiple FEC schemes include an adaptive FEC scheme, and the adaptive FEC scheme is applicable to a source flow divided into one source symbol block or multiple source symbol blocks, and the one source symbol block or each of the multiple source symbol blocks divided from the source flow includes multiple source symbol sub-blocks having different priorities.

BRIEF DESCRIPTION OF DRAWINGS

The above and other aspects, features and advantages of certain exemplary embodiments of the present disclosure will be more apparent from the following description taken in conjunction with the accompanying drawings, in which:

FIG. 8 illustrates an example of rearranging a source symbol block generated by an MMT FEC scheme, based on a priority of a source packet, according to an embodiment of the present disclosure;

MODE FOR CARRYING OUT THE INVENTION

Figure 1:
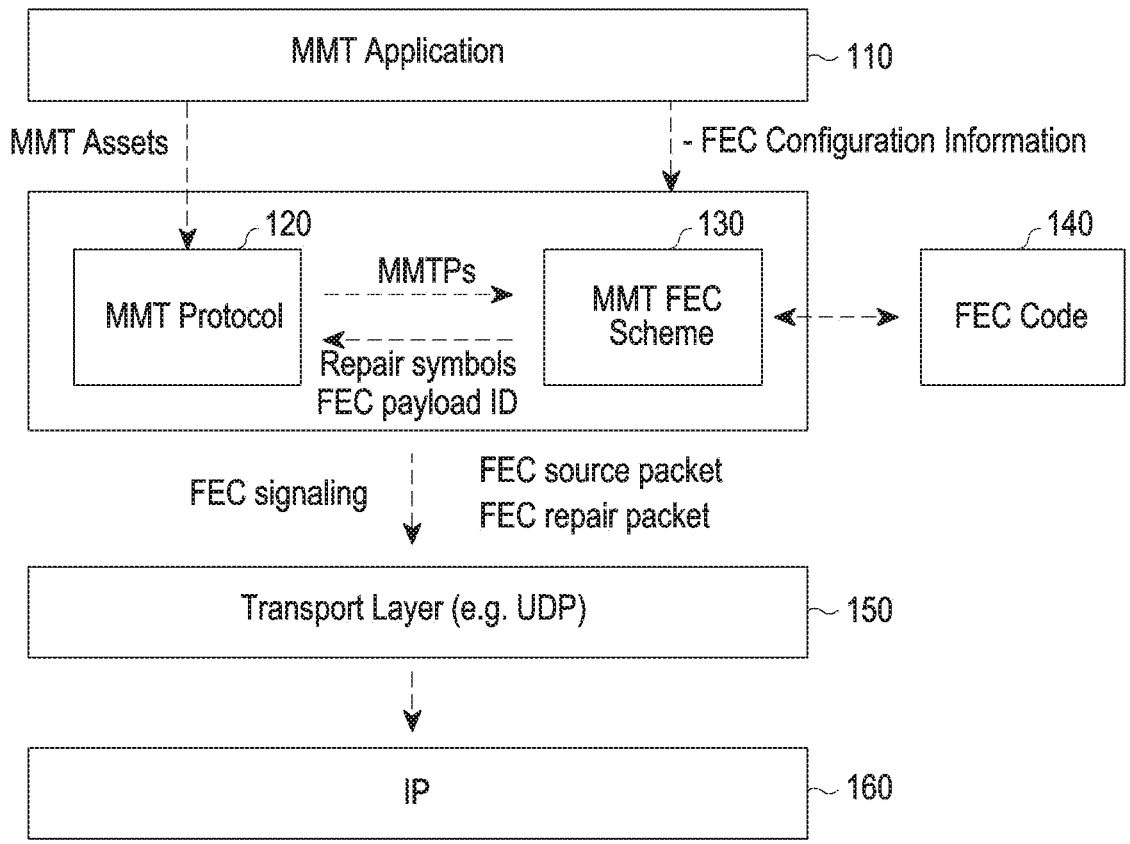
FIG. 1 illustrates a structure to which an application layer forward error correction (AL-FEC) scheme is applied in a Moving Picture Experts Group (MPEG) Media Transport (MMT)-based system, according to an embodiment of the present disclosure.

Hereinafter, embodiments of the present disclosure will be disclosed with reference to the accompanying drawings.

When the embodiments of the present disclosure are described, technical matters that are well known in a technical field of the disclosure and are not directly related to the disclosure will not be described. By omitting any unnecessary description, the subject matter of the embodiments of the present disclosure will be more clearly described without being obscured.

For the same reasons, some elements will be exaggerated, omitted, or simplified in the attached drawings. The size of each element does not entirely reflect the actual size of the element. In each drawing, an identical or corresponding element will be referred to as an identical reference numeral.

Advantages and features of the disclosure and a method for achieving them will be apparent with reference to embodiments of the present disclosure described below together with the attached drawings. However, the embodiments of the present disclosure are not limited to the disclosed embodiments, but may be implemented in various manners, and the embodiments of the present disclosure are provided to allow those of ordinary skill in the art to understand the scope of the present disclosure, and the scope to be claimed of the present disclosure is defined by the category of the claims. Throughout the specification, an identical reference numeral will indicate an identical element.

It will be understood that each block of the flowchart and/or block diagram illustrations, and combinations of blocks in the flowchart and/or block diagram illustrations, may be implemented by computer program instructions. These computer program instructions may also be stored in a general-purpose computer, a special-purpose computer, or a processor of other programmable data processing devices, such that the instructions implemented by the computer or the processor of the programmable data processing device produce a means for performing functions specified in the flowchart and/or block diagram block or blocks. These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks. The computer program instructions may also be loaded onto a computer or other programmable data processing apparatus to cause a series of operational steps to be performed on the computer or other programmable apparatus to produce a computer implemented process, such that the instructions that execute the computer or other programmable apparatus may provide steps for implementing the functions specified in the flowchart and/or block diagram block or blocks.

In addition, each block represents a module, segment, or portion of code, which includes one or more executable instructions for implementing the specified logical function(s). It should also be noted that in other implementations, the function(s) noted in the blocks may occur out of the order indicated. For example, two blocks shown in succession may, in fact, be executed substantially concurrently or the blocks may sometimes be executed in the reverse order, depending on the functionality involved.

The term '~unit' used herein refers to software or a hardware element such as a field-programmable gate array (FPGA), an application specific integrated circuit (ASIC), etc., and '~unit' plays specific roles. However, the meaning of '~unit' is not limited to software or hardware. '~unit' may advantageously be configured to reside on the addressable storage medium and configured to reproduce one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and '~unit(s)' may be combined into fewer components and '~unit(s)' or further separated into additional components and '~unit(s)'. In addition, components and '~unit(s)' may be implemented to execute one or more CPUs in a device or a secure multimedia card.

More specifically, for a multimedia service system to which an embodiment of the present disclosure is applied, a Moving Picture Experts Group (MPEG) Media Transport (MMT)-based system, which is an MPEG media transport technique, will be described as an example. However, an embodiment of the present disclosure is also applicable to other service systems and services as well as the MT system, without largely departing from the scope disclosed herein, as will be determined by those of ordinary skill in the art.

FIG. 1 illustrates a structure to which an application layer forward error correction (AL-FEC) scheme is applied in an MMT-based system, according to an embodiment of the present disclosure. The MMT-based system provides reliable transmission by using an AL-FEC scheme in an Internet protocol (IP) network environment.

Referring to FIG. 1, an MMT application 110 may determine MMT assets to be transmitted with protection through an AL-FEC in an MMT package and input the determined MMT assets to an MMT protocol 120. The MMT application 110 may determine FEC configuration information related to the AL-FEC scheme and input the determined FEC configuration information to an MMT FEC scheme 130. The FEC configuration information may include at least one of the number of FEC source flows for protecting the assets, identification information of an FEC encoded packet flow, an FEC encoding structure, or an FEC code.

Herein, one FEC source flow may protect one or more assets, and the FEC source flow may be configured with a source packet that carries the one or more assets. The FEC source flow and the FEC configuration information may be delivered to the MMT FEC scheme 130. Herein, the MMT FEC scheme 130 may be an element block constituting a transmission function, and may be configured as an FEC encoding unit in the transmitter. The MMT FEC scheme 130 may generate repair symbols constituting one or more FEC repair flows by using one or more FEC codes, divide the FEC source flow into source packet blocks, and generate source symbol blocks.

More specifically, the MMT protocol 120 may packetize input assets into MMT payloads (MMTPs) and add an MMT packet header to generate a source packet. The MMT protocol 120 may input each source packet block including a predetermined number of source packets to an MMT FEC scheme 130. The MMT FEC scheme 130 may generate a source symbol block from respective input source packet blocks according to a source symbol block generation method given based on FEC configuration information input from the MMT application 110. The source symbol block generation scheme according to an embodiment of the present disclosure may be given by the FEC configuration information, and when the FEC configuration information includes the source symbol block generation scheme according to the embodiment of the present disclosure, the MMT FEC scheme 130 generates a source symbol block according to an embodiment of the present disclosure. The MMT FEC scheme 130 that generates the source symbol block may input the source symbol block to an FEC code 140 which may generate a repair symbol lock from an input source symbol block based on an FEC encoding algorithm (e.g., an FEC encoding algorithm described in the International Organization for Standardization (ISO)/the International Electrotechnical Commission (IEC) 23008-10) and input the generated repair symbol block to the MMT FEC scheme 130. The MMT FEC scheme 130 may generate an FEC payload ID for the source symbol block and the repair symbol block, and input repair symbols received from the FEC code 140 to the MMT protocol 120. By using the input repair symbols and the FECT payload ID, the MMT protocol 120 may generate an FEC source packet by adding a source FEC payload ID to the source packet and generate an FEC repair packet by adding the repair FEC payload ID, an MMT payload header, and an MMT packet header to the repair symbol. Thereafter, the MMT protocol 120 may transmit the generated FEC source packet and FEC repair packet to the receiver through a transport layer 150 such as a user datagram protocol (UDP) and an IP layer 160.

While it has been described for the convenience of description that FEC source packets and FEC repair packets are generated and transmitted on a source packet block basis, it is preferred in an actual network environment that the MMT protocol 120 inputs a generated source packet to the MMT FEC scheme 130 simultaneously with adding a source FEC payload ID to the generated source packet to generate an FEC source packet and transmitting the FEC source packet, and the MMT FEC scheme 130 may store the source packet in an internal memory, generate a source symbol block out of the source packet block at the moment the last source packet for the source packet block is stored input so that the FEC code 140 may generate a parity symbol block, input the generated parity symbol block along with an FEC payload ID to the MMT protocol 120 to generate and transmit FEC repair packets.

An MMT protocol of a receiver (not shown in the figures and including a configuration corresponding to the transmitter of FIG. 1) in the MMT-based system may deliver an FEC source flow and one or more FEC repair flows related to the FEC source flow to an MMT FEC scheme. Herein, the MMT FEC scheme included in the receiver may include an FEC decoding unit in the receiver. In the receiver, the MMT FEC scheme may attempt to recover lost MMTP packets and deliver the recovered MMTP packets to an MMP protocol.

The MMT FEC scheme 130 described in FIG. 1 may operate in two different modes. That is, FEC payload ID mode 0 may indicate a mode in which a source FEC payload ID is added to an MMTP packet, and FEC payload ID model may indicate a mode in which any deformation is not applied to an MMTP packet.

The MMT FEC scheme 130 may constitute packets including layered or non-layered media data into multiple levels by using an FEC encoding structure included in the FEC configuration information input from the MMT application 110. This enables application of a needed protection level to each asset of one FEC source flow. The FEC source flow may be an MMTP sub flow that delivers signaling messages.

An example of an FEC encoding structure may include a two-stage FEC encoding structure and a layer-aware FEC (AL-FEC) coding structure.

Figure 2:
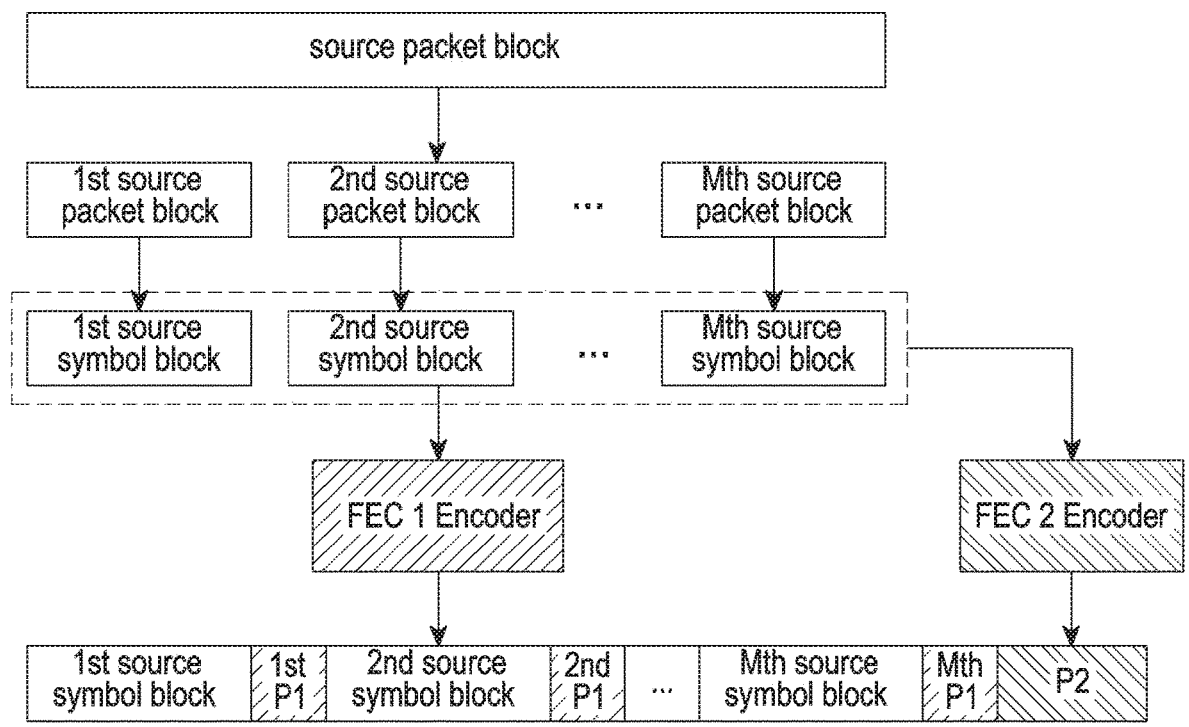
FIG. 2 illustrates an example of a two-stage FEC encoding structure applied to an MMT-based system, according to an embodiment of the present disclosure.

FIG. 2 illustrates an example of a two-stage FEC encoding structure applied to an MMT-based system, according to an embodiment of the present disclosure.

Referring to FIG. 2, in a two-stage FEC encoding structure, one source packet block may be divided into M (>1) source packet blocks. Among M divided source packet blocks, an $i^{th}$ (i=1, 2, ..., M) source packet block may be converted into an $i^{th}$ source symbol block by using one of source symbol block generation methods according to an embodiment of the present disclosure. The source symbol block generation methods according to an embodiment of the present disclosure will be described in detail with reference to FIGS. 4 through 7. The $i^{th}$ source symbol block may be encoded using a first FEC code. A single source symbol block may be generated by connecting the M divided source symbol blocks, and may be encoded using a second FEC code. In a process of encoding the M divided source symbol blocks by using the first FEC code, M repair symbol blocks P1 may be generated, and in a process of encoding the single source symbol block by using the second FEC code, one repair symbol block P2 may be generated.

Figure 3:
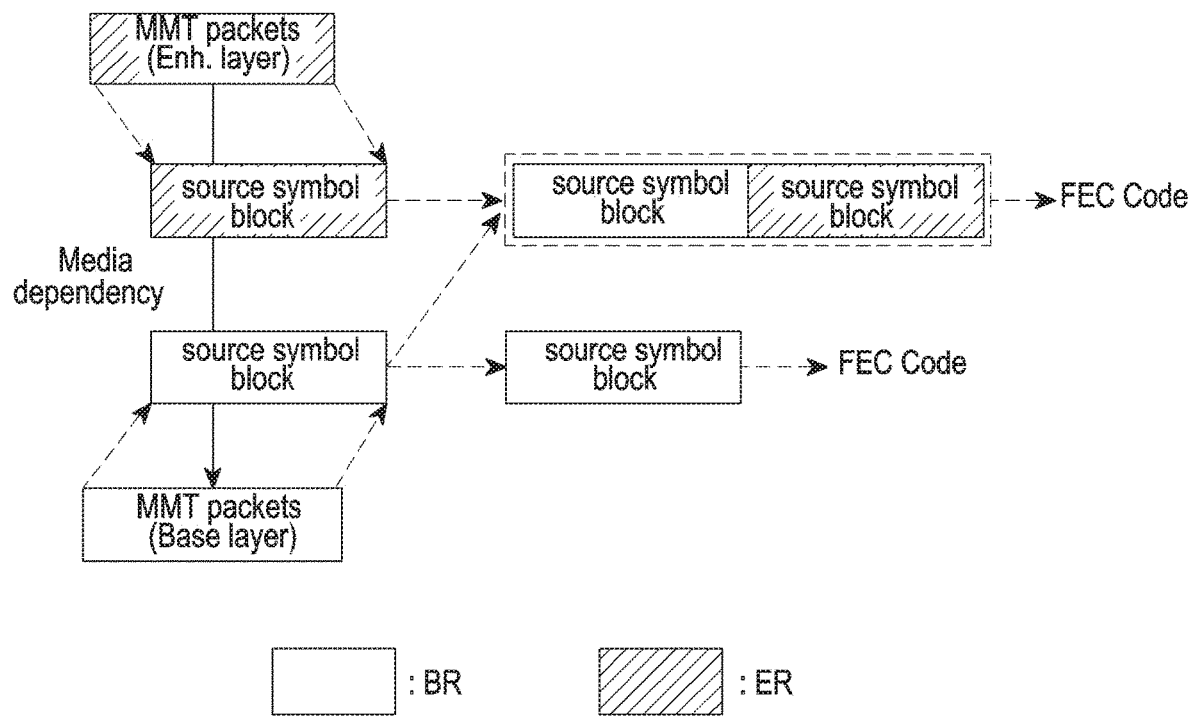
FIG. 3 illustrates an example of a two-stage layer-aware (LA)-FEC encoding structure applied to an MMT-based system, according to an embodiment of the present disclosure.

FIG. 3 illustrates an example of a two-stage LA-FEC encoding structure applied to an MMT-based system, according to an embodiment of the present disclosure.

Referring to FIG. 3, base representation (BR) of a base layer is data that is independently decodable data in a media codec, and enhancement representation (ER) of an enhancement layer is data dependent on BR.

The LA-FEC encoding structure may be an FEC encoding structure specified to layered media data (e.g., scalable video coding (SVC), multiview video coding (MVC), etc.). The LA-FEC encoding structure may use relation between media layers, and each media layer may have a related FEC repair flow. Herein, the FEC repair flow may protect data of the related media layer and data of any media layer on which the related media layer depends (hereinafter, referred to as a complementary layer) together.

In the LA-FEC encoding structure, source packets including data of each media layer are grouped into a different source symbol block for each layer. A source symbol block used in generation of repair symbols constituting one FEC repair flow has a form of a combination of a source symbol block including data of the media layer related to the FEC repair flow and a source symbol block including complementary layer data of the related media layer. The combination of the source symbol blocks including the data of the different layers follow a media layer structure. That is, each source symbol block follows a source symbol block including complementary layer data of media data included in the source symbol block.

The encoding symbol block generated based on the FEC encoding structure as shown in FIG. 2 or 3 may include the source symbol block and a repair symbol block generated from the source symbol block. The source symbol block may be configured according to a scheme agreed between the transmitter and the receiver, and a multimedia service system according to an embodiment of the present disclosure may define one or more source symbol block generation methods and select one of them depending on a need to generate the source symbol block. Hereinbelow, the source symbol block generation method will be referred to as a source symbol block generation mode (SSBG) mode. The SSBG mode selected by the transmitter may be delivered to the receiver through a signaling message.

Hereinbelow, referring to FIGS. 4 through 7, a description will be made of a method of generating a source symbol block based on an SSBG mode in a multimedia service system, according to an embodiment of the present disclosure.

Figure 4:
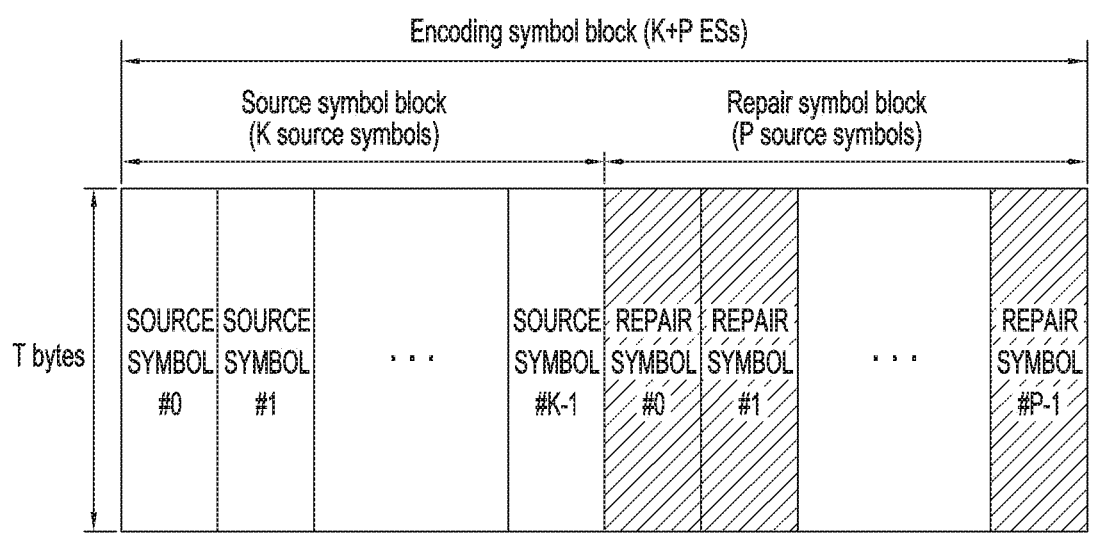
FIG. 4 illustrates an example of an encoding symbol block encoded by an MMT FEC scheme, according to an embodiment of the present disclosure.

FIG. 4 illustrates an example of an encoding symbol block encoded by an MMT FEC scheme, according to an embodiment of the present disclosure.

Referring to FIG. 4, an encoding symbol block may include a source symbol block including k source symbols and a repair symbol block including P repair symbols. In this case, the lengths of any source symbol and any repair symbol included in the encoding symbol block may be equal to each other as T bytes.

In the multimedia service system according to an embodiment of the present disclosure, an FEC source flow may be divided into source packet blocks and protected. Source packets included in the source packet block may have a fixed or variable length, and the source packet block may be converted into a source symbol block for FEC encoding according to an SSBD mode to be described later.

In the multimedia service system according to an embodiment of the present disclosure, an MMT FEC scheme may use three types of SSBG modes defined as ssbg_mode0, ssbg_mode1, and ssbg_mode2 in generation of a source symbol block. ssbg_mode0 may be used when all MMTP packets have the same length, and ssbg_mode1 and ssbg_mode2 may be used when an MMTP packet has a variable length.

Figure 5:
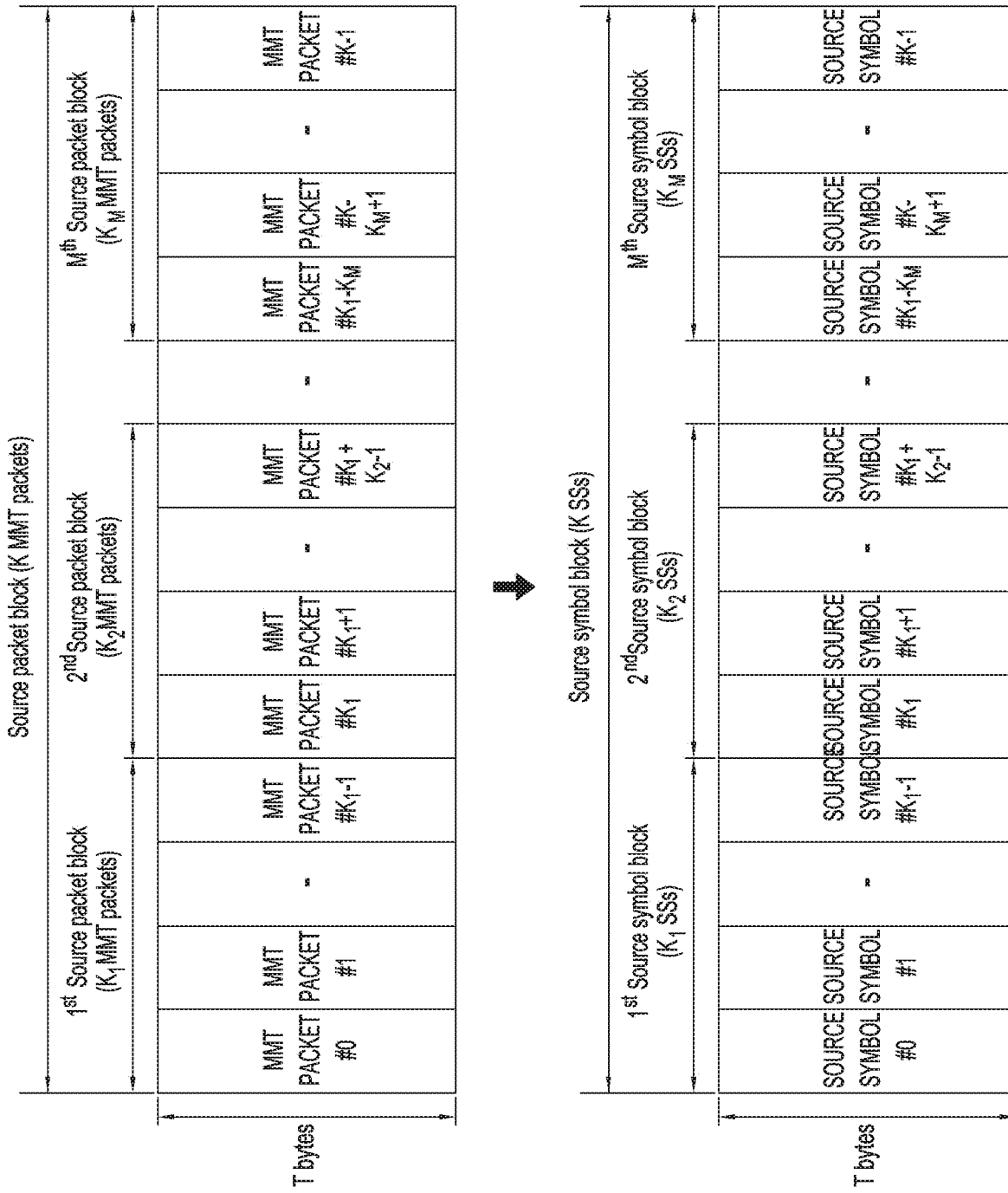
FIG. 5 illustrates an example of a source symbol block generated based on ssbg_mode0 by an MMT FEC scheme, according to an embodiment of the present disclosure.

FIG. 5 illustrates an example of a source symbol block generated based on ssbg_mode0 by an MMT FEC scheme, according to an embodiment of the present disclosure.

Referring to FIG. 5, when ssbg_mode0 is used, all MMTP packets have the same length such that a source symbol block coincides with a source packet block. This means that the number of MMTP packets included in the source packet block is exactly equal to the number of source symbols included in the source symbol block, and an $i^{th}$ MMTP packet of the source packet block is identical to an $i^{th}$ symbol of the source symbol block (i=0, 1, ..., K-1). When a two-stage FEC encoding structure or an LA-FEC encoding structure is applied (M>1), an $i^{th}$ source symbol block may be generated from an $i^{th}$ source packet block (i=0, 1, ..., M-1).

Figure 6:
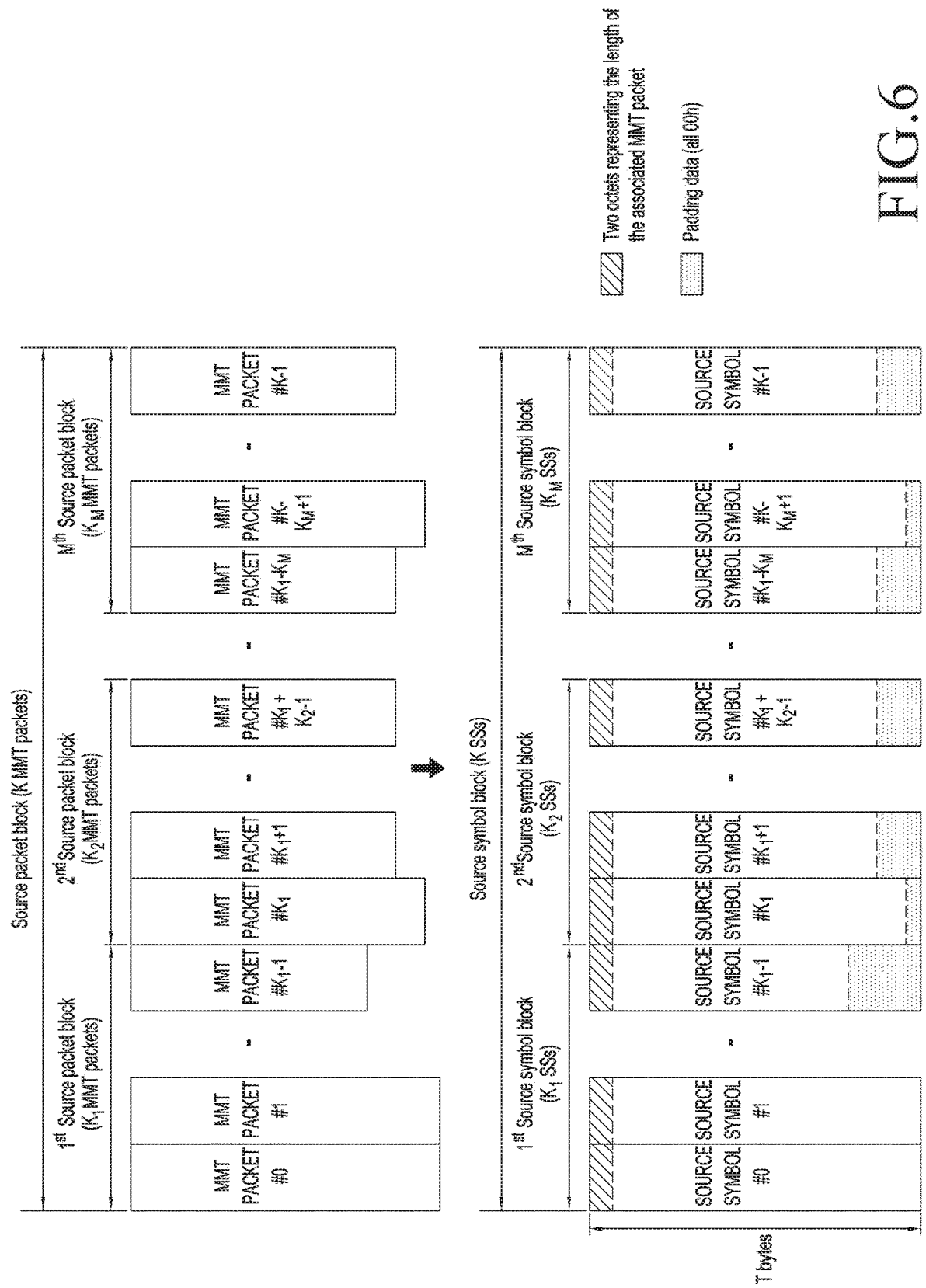
FIG. 6 illustrates an example of a source symbol block generated based on ssbg_mode1 by an MMT FEC scheme, according to an embodiment of the present disclosure.

FIG. 6 illustrates an example of a source symbol block generated based on ssbg_mode1 by an MMT FEC scheme, according to an embodiment of the present disclosure.

Referring to FIG. 6, in ssbg_mode1, a source symbol block is generated in the same manner as in ssbg_mode0, except that each source symbol includes a length of an MMTP packet related to the source symbol and, depending on a need, a padding byte. That is, the number of MMTP packets included in the source packet block is equal to the number of source symbols included in the source symbol block related to the source packet block. In ssbg_mode1, an $i^{th}$ source symbol starts with two octets indicating the length of the $i^{th}$ MMTP packet of the related source packet block, which are arranged in a network byte order (the upper octet first), and then octets of an MMTP packet #i may be arranged and the other part may be filled with 0 octet. When a two-stage encoding structure and an LA-FEC encoding structure (M>1) are used, the $i^{th}$ source symbol block may be generated from the $i^{th}$ source packet block (i=0, 1, . . . , M-1), in which source symbols included in each source symbol block may include a padding byte (00 h) at the end thereof.

Figure 7:
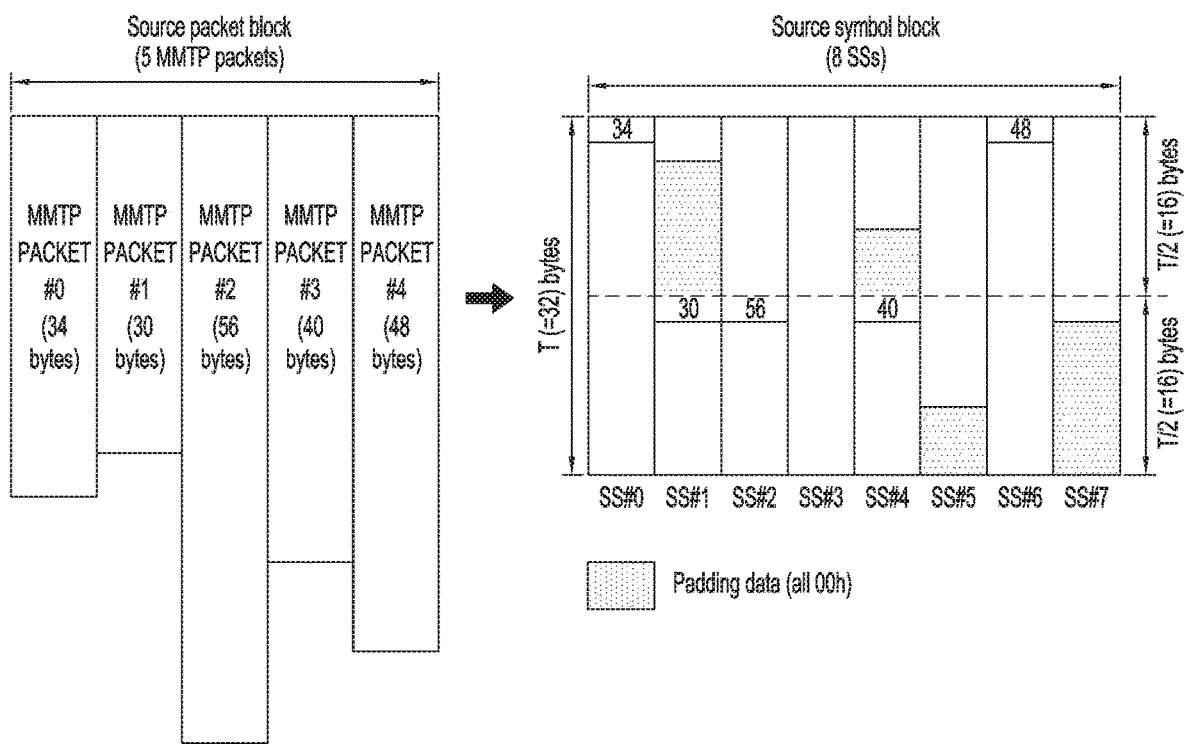
FIG. 7 illustrates an example of a source symbol block generated based on ssbg_mode2 by an MMT FEC scheme, according to an embodiment of the present disclosure.

FIG. 7 illustrates an example of a source symbol block generated based on ssbg_mode2 by an MMT FEC scheme, according to an embodiment of the present disclosure.

Referring to FIG. 7, in ssbg_mode2, one source symbol block may be generated from a source packet block including Ksp source packets, and may include Kss source symbols that may include padding bytes 00 h. Each source symbol may equally include N symbol elements, and this means that one source symbol block includes N * Kss symbol elements. An MMTP packet #0 of the source packet block is located in s0 initial symbol elements of a related source symbol block. More specifically, first two bytes of the first symbol element among s0 symbol elements may start with two octets in a network byte order, which indicate a length of an MMTP packet #0, and then octets of the MMTP packet #0 may be arranged and the other part may be filled with zero octet. The $1^{st}$ MMTP packet of the source packet block may be arranged as next s1 symbol elements in the source symbol block like the $0^{th}$ MMTP packet. After the source symbol block is filled up to MMTP packets #Ksp-1 in the same manner, when Kss*T-sumsi*T/N (i=0, . . . , Ksp-1) is not 0, zero octets may be arranged as the other symbol elements of the source symbol block.

In the two-stage encoding structure and the LA-FEC encoding structure, a single source symbol block for a second FEC code may be generated by connecting all source symbol locks generated from the divided M source packet blocks.

Definitions of detailed values in the SSBG mode are as below.

Ksp: the number of MMTP packets included in a source packet block
Kss: the number of source symbols included in a source symbol block
Ri: an octet of an $i^{th}$ MMTP packet to be added to a source symbol block
Si: a length of Ri expressed in the unit of an octet
Li: Si value expressed with two octets in a network byte order
T: source symbol size expressed with bytes
N: the number of symbol elements of one source symbol
T': a size of a symbol element, expressed with bytes (T'=T/N)
si: the least integer satisfying si*T/N=siT'>=(Si+2)
Pi: si*T'-(Si+2) zero octets
P: Kss * T-sumsi*T' zero octets (i=0, . . . , Ksp-1)

In this case, the source symbol block may be configured by sequentially connecting Li, Ri, and Pi with P (i=0, . . . , Ksp-1) and dividing them into source symbols each having a size of T.

Referring back to FIG. 7, lengths of five MMTP packets are 34, 30, 56, 40, and 48 bytes, respectively, and are arranged in a source symbol block composed of eight source symbols. The size T of each source symbol is 32, and each source symbol includes two symbol elements (T'=T/2=16 bytes).

In the MMT FEC scheme according to an embodiment of the present disclosure, a source symbol block generated in the SSBG mode may be rearranged, and a repair symbol block may be generated based on the rearranged source symbol block. The number of source symbols of the rearranged source symbol block is equal to the number of source symbols of the related source symbol block.

When the source symbol block is rearranged, the priorities of source packets related to the source symbols in the source symbol block may be considered. For example, when the source packets of the source packet block have N different priorities, a source symbol block generated from the source packet block may be rearranged as groups having N priorities. A priority of each group is such that a source symbol related to a source packet having the lowest priority is arranged front, and the order of symbols in each group is such that the symbols are rearranged according to the order of the input source packet. For example, when MMT is used, the priorities of the source packets may be obtained from the following information:

A priority given to each asset in a bundle or each bundle in bundle delivery characteristics;
A priority given to each MFU in an MPU in a hint sample; and
A priority given to each packet by using information of a priority field in an MMTP header.

Thus, the MMT FEC scheme may rearrange the source symbols in the source symbol, taking the priority of the source packet into account. The MMT FEC scheme may include a buffer for rearranging the source symbols in the source symbol, and the buffer may buffer the source symbols until the source symbol block is completed in FEC encoding. When the source packets in the source flow are converted into source symbols for AL-FEC encoding that changes the orders of the source packets and the source symbols, the buffer may perform buffering without transmitting the source symbols until the source symbol block is completed. Once one source symbol block is completed, the positions of the source symbols in the source symbol block may be rearranged according to the priorities of the source packets, as shown in FIG. 8.

Figure 8:
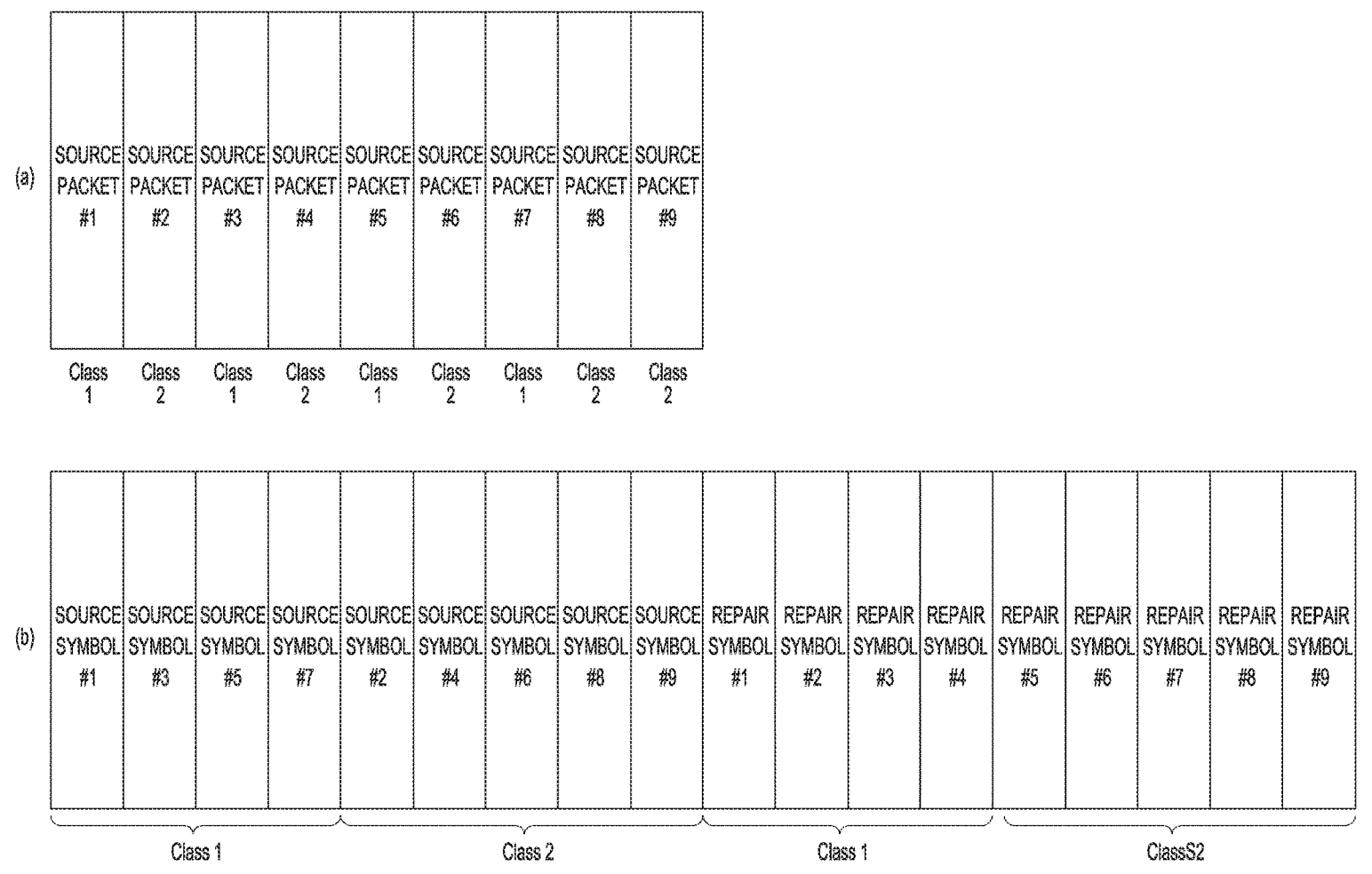

FIG. 8 illustrates an example of rearranging a source symbol block generated by an MMT FEC scheme, based on a priority of a source packet, according to an embodiment of the present disclosure.

Referring to FIG. 8, a source symbol block is generated in an order in which source packets are input. For example, when source packets #1 through #9 are input in generation of the source symbol block, they may be stored in the order from the source packet #1 to the source packet #9. In this case, all source symbols included in the source symbol block may have two priorities Class 1 and Class 2 according to the priorities of the source packets. Thus, based on the two priorities, the MMT FEC scheme may rearrange an FEC code and source symbols stored in a buffer in the source symbol block. Consequently, a source symbol sub-block may be generated in a source symbol for each priority, such that the source packets #1, #3, #5, and #7 may be rearranged and located in the first source symbol sub-block, and the other source symbols may be located in the second source symbol sub-block.

In an embodiment of the present disclosure, as shown in FIG. 8, after the source symbols included in the source symbol block are rearranged, a repair symbol block including repair symbols may be generated based on the rearranged source symbol block.

A source symbol block and a repair symbol block according to an embodiment of the present disclosure may include two or more source symbol sub-blocks and repair symbol sub-blocks, respectively. As in an example shown in FIG. 9, the number of source symbol sub-blocks constituting the source symbol block may be equal to the number of repair symbol sub-blocks constituting a related repair symbol block. Each repair symbol sub-block may include one or more related source symbol sub-blocks, and a repair symbol included in the repair symbol sub-block may be generated using source symbols selected from the related source symbol sub-blocks.

When the source symbol block is divided into source symbol sub-blocks, the priority of the source packet related to the source symbol may be considered. For example, when the source packets of the source packet block have N different priorities, the source symbol block generated from the source packet block may include N source symbol sub-blocks.

Figure 9:
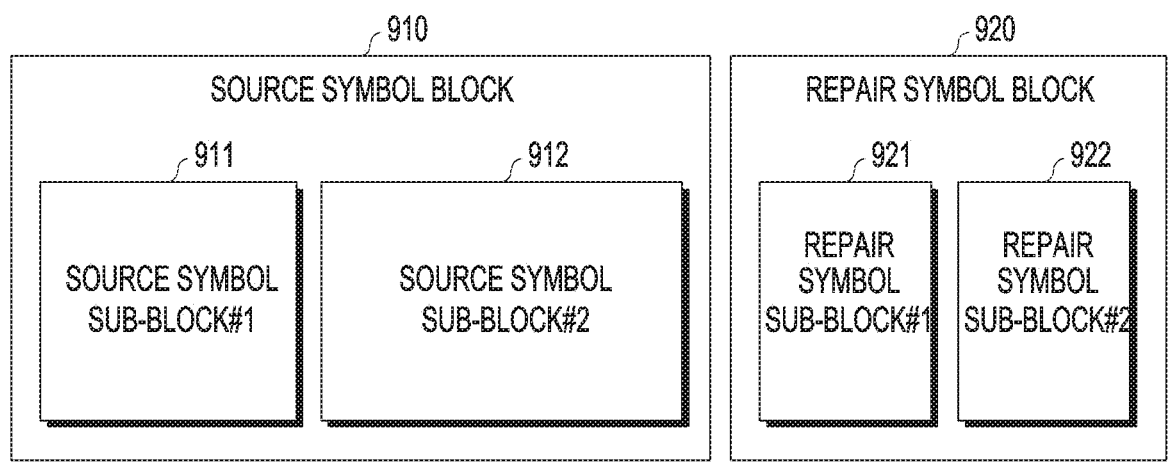
FIG. 9 illustrates an example of a source symbol block and a repair symbol block, according to an embodiment of the present disclosure.

When the source symbol block is divided into the source symbol sub-blocks based on the priorities of the source packets, each repair symbol sub-block may include one or more related source symbol sub-blocks, and the repair symbol included in the repair symbol sub-block may be generated using the source symbols selected from the related source symbol sub-blocks, as in an example shown in FIG. 9.

FIG. 9 illustrates an example of a source symbol block and a repair symbol block, according to an embodiment of the present disclosure.

Referring to FIG. 9, a source symbol block 910 may include a source symbol sub-block #1 911 and a source symbol sub-block #2 912, and a repair symbol block 920 may include a repair symbol sub-block #1 921 and a repair symbol sub-block #2 922. All source symbols included in the source symbol block 910 should belong to one of the source symbol sub-block #1 911 or the source symbol sub-block #2 912. Likewise, all source symbols included in the repair symbol block 920 should belong to one of the repair symbol sub-block #1 921 or the repair symbol sub-block #2 922.

Figure 10:
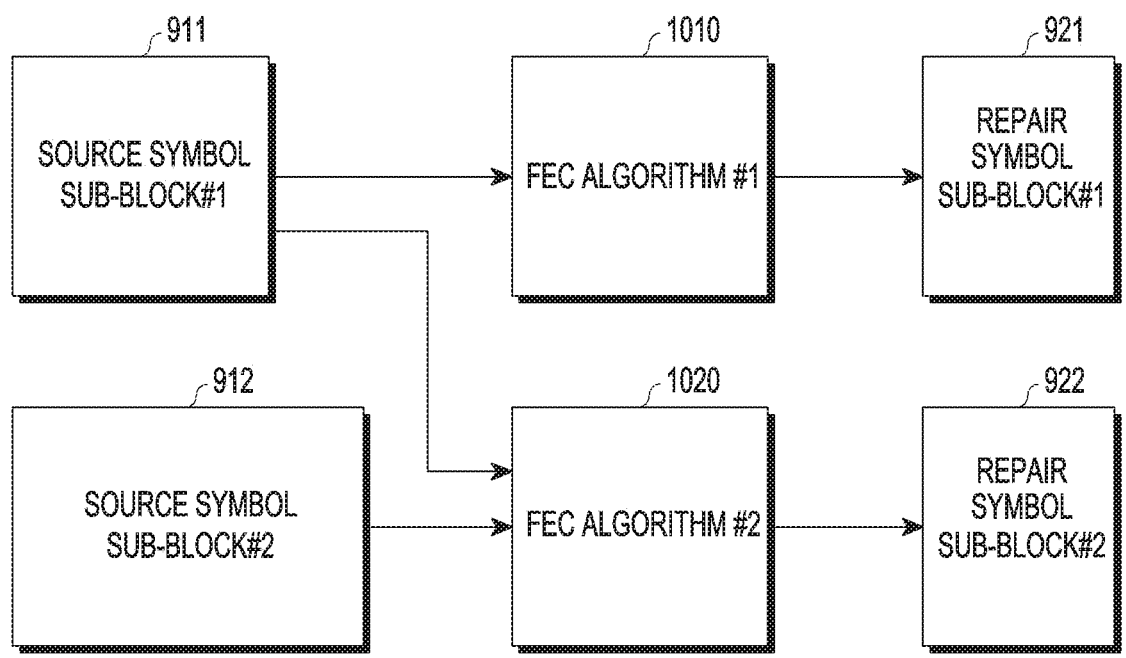
FIG. 10 illustrates an example of a process of generating a repair symbol block, according to an embodiment of the present disclosure.

FIG. 10 illustrates an example of a process of generating a repair symbol block, according to an embodiment of the present disclosure.

Referring to FIG. 10, the repair symbol sub-block #1 921 may be generated by applying an FEC algorithm #1 1010 to the source symbol sub-block #1 911. The repair symbol sub-block #2 922 may be generated by applying an FEC algorithm #2 1020 to the source symbol sub-block #1 911 and the source symbol sub-block #2 912.

The FEC code according to an embodiment of the present disclosure may output repair symbols as an input to a source symbol block including N source symbol sub-blocks, and the repair symbol may constitute a repair symbol block including N repair symbol sub-blocks. Among the source symbol sub-blocks, an $i^{th}$ source symbol sub-block will be defined as SSB[i], and the number of source symbols included in SSB[i] will be defined as SSBL[i]. Likewise, among the repair symbol sub-blocks, an ith repair symbol sub-block will be defined as RSB[i], and the number of repair symbols included in RSB[i] will be defined as RSBL[i]. A function of generating the repair symbols included in RSB[i] and giving sequence numbers to the generated repair symbols will be defined as FEC_algo#i( ).

Thereafter, for convenience, the FEC code according to an embodiment of the present disclosure is assumed to have the following restrictions:

RSB[1]=FEC_algo#1 (SSB[1]; SSBL[1], RSBL[1])

RSB[2]=FEC_algo#2 (SSB[1], SSB[2]; SSBL[1], SSBL[2], RSBL[1], RSBL [2])

. . .

RSB[N]=FEC_algo#N (SSB[1], . . . , SSB[N]; SSBL[1], . . . , SSBL[N], RSBL[1], . . . , RSB[N])

In the foregoing restrictions, FEC_algo#i indicates an algorithm that outputs values and sequence numbers of the repair symbols of RSB[i] by using source symbols included in SSB[1], . . . , SSB[i] as inputs and using SSBL[1], . . . , SSBL[i] and RSBL[1], . . . , RSBL[i] as parameters.

In the multimedia service system according to an embodiment of the present disclosure, an MMT FEC scheme that protects an MMTP packet with an FEC code will be defined as an adaptive FEC scheme. The adaptive FEC scheme may be used for encoding of an FEC source flow (i.e., an FEC source packet) having different priorities. In order for a receiver to recover lost MMTP packets in a multimedia service protected with the adaptive FEC scheme, the following information needs to be additionally delivered to the receiver when compared to the use of another FEC scheme with N=1.

the number of source symbol sub-blocks constituting a source symbol block, N (>1)

the number of symbols constituting each source symbol sub-block, SSBL[i]

the number of symbols constituting each repair symbol sub-block, RSBL[i]

As described with reference to FIGS. 8 through 10, when a repair symbol is generated based on information of a source symbol block in FEC encoding, a source FEC payload ID and a repair FEC payload ID may be generated. When transmitting source and repair FEC packets, the transmitter needs to the source FEC payload ID and the repair FEC payload ID together through each packet. The transmitter then may decode the packet by using a value FFSRP_TS in the source FEC payload ID. The value FFSRP_TS may indicate a time when the transmitter transmits the packet, and may follow a timestamp of a packet header. In packet decoding, a time of an FEC decoding buffer may be calculated using a value protection_window_time in an FEC message for the packet header and the timestamp in the payload ID.

However, like in an embodiment of the present disclosure, when the orders of packets and symbols are changed, the source packets may not be transmitted until the source symbol block is completed in the buffer and then the source and repair FEC payload IDs are generated based on the rearranged source symbol block. In this case, the source packet may be delayed without being transmitted to the receiver until the source FEC payload ID is generated. After the source FEC payload ID is generated, the transmitter may transmit an input source packet in the order of the input source packet. For the FFSRP_TS value in the source FEC payload ID of the first source packet, a time after the source symbol block may be delivered to the receiver.

Like in an embodiment of the present disclosure, when the orders of the packets and the symbols are changed, the transmitter may pass through encoding after buffering the packet with a separate buffer. In this case, a separate re-order buffer delay (RBD) may be calculated using Equation 1.

Re-Order Buffer Delay (RBD) of Encoder=Duration of Source Symbol Block (MPU Duration*Number of MPUs Constituting Source Symbol Block)     Equation 1 where the length of the source packet may be set for each asset, and a predefined value may be used depending on a type of an asset or the transmitter may deliver the predefined value to the receiver by using a separate signaling message. A delay caused by rearrangement of a source symbol in a source symbol block after generation of the source symbol block is not considered. To the delay caused in encoding, information may be reflected as a timestamp of a packet header in transmission of a source FEC packet, and the information may be transmitted as the value FFSRP_TS in the source FEC payload ID, such that the transmitter may not need to transmit separate information to the receiver.

In an embodiment of the present disclosure, when one MPU duration is 0.5 seconds and one source symbol block includes two MPUs, an RBD of the encoder may be one second. Thus, when a basic transmission time of a packet is 12:00 prior to use of an AL-FEC scheme, a transmission time in a packet header and a payload ID after use of another FEC scheme having other orders of the packets and the symbols may be 12:01.

The receiver may use the packet transmission time for decoding. More specifically, the receiver may perform FEC decoding as shown in FIG. 11.

Figure 11:
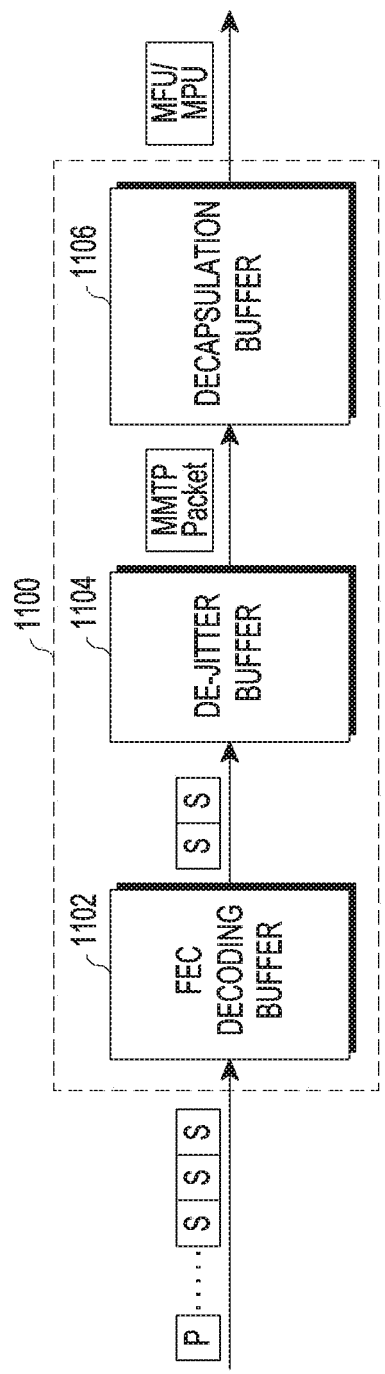
FIG. 11 illustrates an example of an FEC decoding process in a receiver, according to an embodiment of the present disclosure.

FIG. 11 illustrates an example of an FEC decoding process in a receiver, according to an embodiment of the present disclosure. In FIG. 11, a receiver 1100 may include an MMT FEC scheme for FEC decoding. For example, the MMT FEC scheme may include an AL-FEC decoding buffer 1102, a de jitter buffer 1104, and a decapsulation buffer 1106.

Referring to FIG. 11, the receiver 1100 may receive AL-FEC-encoded packets P, . . . , S, S, S from the transmitter through a transmission network. Then, the AL-FEC decoding buffer 1102 may perform AL-FEC decoding with respect to received packets and output the AL-FEC-decoded packets to the de jitter buffer 1104. A fixed end-to-end delay D preconfigured to include the jitter may be applied to the packets output from the de jitter buffer 1504, such that the packets may be output at the same time and delivered to the MMTP decapsulation buffer 1106.

Like in an embodiment of the present disclosure, when the orders of the packets and the symbols are changed, the receiver may pass through decoding after buffering the received packet with a separate buffer. An RBD for rearrangement of a received source symbol in decoding may be calculated using Equation 2.

Re-Order Buffer Delay of Decoder=Sizes of Source and Repair Symbol Blocks (Byte)/Maximum Bit Rate     Equation 2 where the maximum bit rate is set for each asset, and a predefined value may be used for the maximum bit rate depending on a type of an asset or the transmitter may deliver a set value to the receiver by using a separate signaling message.

The sizes of the source and repair symbol blocks may be calculated based on AL-FEC configuration information received in the form of an AL-FEC message, like in Equation 3. The AL-FEC configuration information may include a 'length of a repair symbol', a 'maximum value k for a repair flow', and a 'maximum value p for the repair flow' to be used for calculation of the maximum size of the AL-FEC decoding buffer. Herein, the length of the repair symbol is in a byte unit, k is defined by a maximum number of source symbols, and p is defined by a maximum number of repair symbols.

Sizes of Source and Repair Symbol Blocks=Length of Repair Symbol×(K+p)     Equation 3

When the orders of the packets and the symbols are changed like in the embodiment of the present disclosure, the receiver may receive the initial source FEC packet in decoding and then receive the source and repair FEC packet by a re-order buffer delay, and then perform decoding based on received information.

When decoding is performed without performing buffering by a separate re-order buffer delay like in an existing FEC method, mismatch between a source symbol and a repair symbol generated from an FEC packet received by the receiver in decoding may occur, making it impossible to perform decoding. Thus, the receiver may buffer source and repair symbols by an RBD and then generate a source symbol block and a repair symbol block, after which the receiver may rearrange source symbols in the source symbol block based on priority information and perform decoding.

Next, two transmission packet formats for transmitting a packet in a multimedia service system according to an embodiment of the present disclosure will be described. One of the two transmission packet formats may be an FEC source packet format for transmitting the source packet, and the other may be an FEC repair packet format for transmitting the repair symbol.

Figure 12:
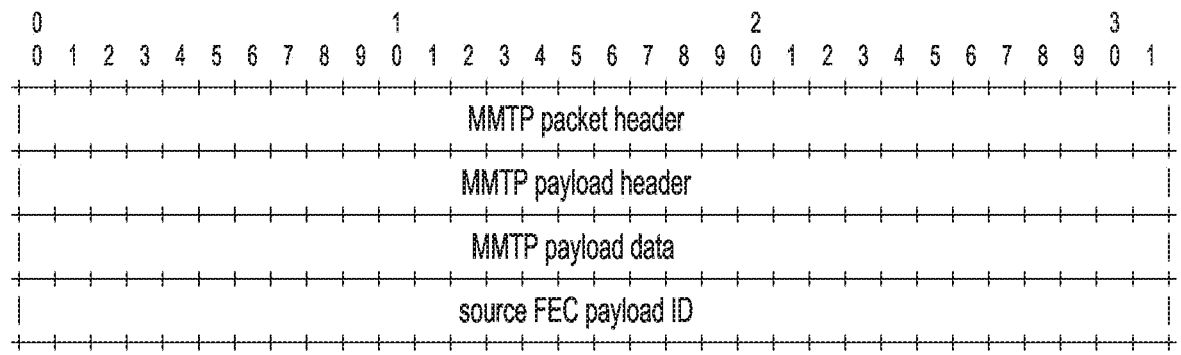
FIG. 12 illustrates an example of an FEC source packet format, according to an embodiment of the present disclosure.
Figure 13:
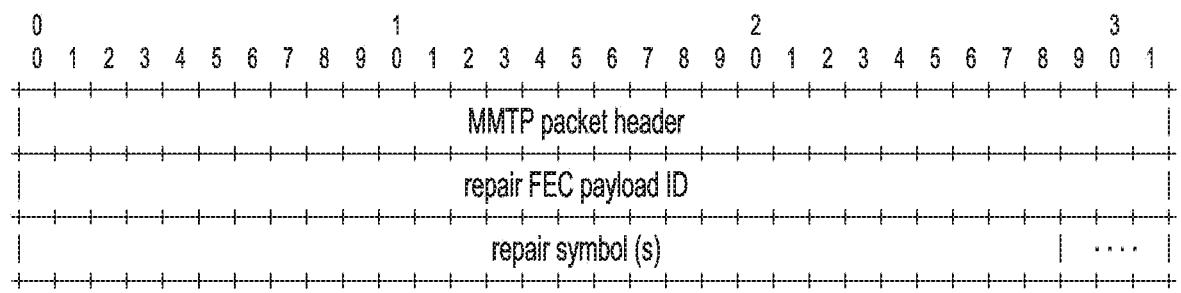
FIG. 13 illustrates an example of an FEC repair packet format, according to an embodiment of the present disclosure.

As shown in FIG. 12, the FEC source packet may have a form in which a source FEC payload ID is added to an MMTP packet, and as shown in FIG. 13, the FEC repair packet format may include an MMTP packet header, a repair FEC payload ID, and one or more repair symbol. The source FEC payload ID included in the FEC source packet may provide information for identifying a source symbol or symbol element carried by the FEC source packet. The repair FEC payload ID included in the FEC repair packet may provide information for identifying a repair symbol(s) included in the FEC repair packet and a related source packet block.

More specifically, FIG. 12 illustrates an example of an FEC source packet format, according to an embodiment of the present disclosure. Referring to FIG. 12, the FEC source packet may include an MMTP packet header, an MMTP payload header, MMTP payload data, and source FEC payload ID. The source packet protected by the MMT FEC scheme may include the MMTP packet header, the MMTP payload header, and the MMTP payload data of FIG. 12.

FIG. 13 illustrates an example of an FEC repair packet format, according to an embodiment of the present disclosure. Referring to FIG. 13, the FEC repair packet may include an MMTP packet header, a repair FEC payload ID, and one or more repair symbol(s). When ssbg_mode0 or ssbg_mode1 is used, the FEC repair packet may include one repair symbol. When ssbg_mode2 is used, the FEC repair packet may include one or more repair symbols. The other FEC repair packets except for the last FEC repair packet among FEC repair packets included in the FEC repair packet block should include the same number of repair symbols.

The transmitter using the MMT FEC scheme should deliver information required for recovering a lost source packet using an FEC source packet and an FEC repair packet received from the receiver. Thereafter, the required information will be defined as the FEC configuration information. The FEC configuration information may be transmitted through an FEC source/repair packet according to a purpose and characteristics thereof or may be transmitted through a signaling message delivered through a separate packet other than the FEC source/repair packet.

A source FEC payload ID of the FEC configuration information may be included in the last part of the FEC source packet like in an example of the FEC source packet format shown in FIG. 12.

Figure 14:
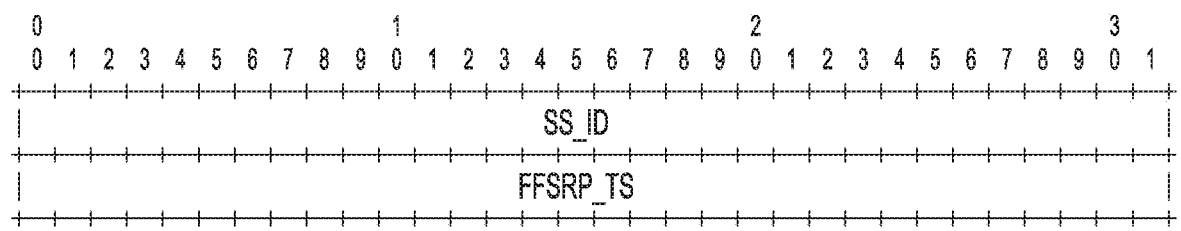
FIG. 14 illustrates an example of a source FEC payload identification (ID) format included in an FEC source packet, according to an embodiment of the present disclosure.

FIG. 14 illustrates an example of a source FEC payload ID format included in an FEC source packet, according to an embodiment of the present disclosure.

Referring to FIG. 14, a source FEC payload ID format may include an SS_ID field and an FFSRP_TS field. An example of usages of the SS_ID field and the FFSRP_TS field are as below.

SS_ID (32 bits)—indicates a sequence number capable of identifying source symbols included in an FEC source packet. The sequence number then returns to 0 after a maximum value. When ssbg_mode0 or ssbg_mode 1 is used, SS_ID may increase one by one for each FEC source packet. When ssbg_mode==10, a sequence number may increase one by one for each symbol element (including a symbol element composed of padding) and SS_ID may be set to a sequence number of the first symbol element included in an FEC source packet. When an LA-FEC encoding structure is used, the lowest SS_ID of the source symbol block should be equal to SS_ID_max+1. Herein, SS_ID_max may be the highest SS_ID of a preceding source symbol block of all flows.

Figure 15:
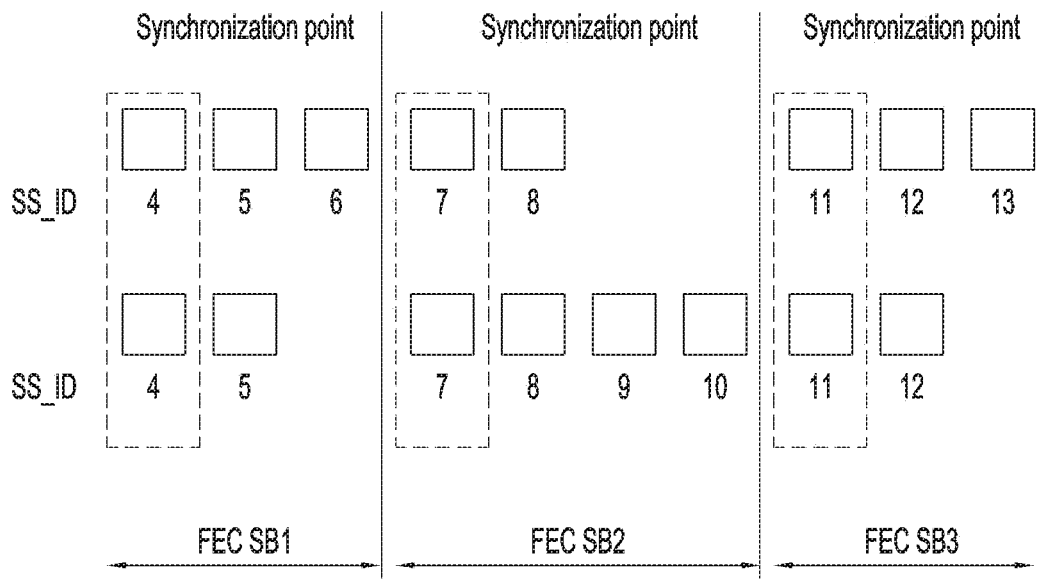
FIG. 15 illustrates an example of a method of configuring SS_ID when an LA-FEC scheme is used, according to an embodiment of the present disclosure.

FIG. 15 illustrates an example of a method of configuring SS_ID when an LA-FEC scheme is used, according to an embodiment of the present disclosure. Referring to FIG. 15, the first SS_ID of the same source symbol block in each flow may be used as a synchronization point of all source symbol blocks of all the flows.

FFSRP_TS (4 bytes)—FFSRP_TS may be composed of TS_Indicator (1 bit) and FP_TS (31 bits).

TS_Indicator (1 bit)—indicates a timestamp in FEC (referring to a value of TS_Indicator in Table 1). For one-stage FEC encoding structure and LA-FEC, a value of this field needs to be set to "0". For two-stage FEC encoding structure (M>1), when this field is set to "1", it may indicate that FP_TS (31 bits) is a value for an FEC source or repair packet block; for "0", it may indicate that next FP_TS (31 bits) is a value for an $i^{th}$ FEC source or repair packet block (M>1 and i=1, 2, . . . , M) of the two-stage FEC encoding structure. For two-stage FEC encoding structure (M>1), for an odd-numbered FEC source packet of an $i^{th}$ FEC source packet block, this field may be set to "0"; for an even-numbered FEC source packet of the $i^{th}$ FEC source packet block, this field may be set to "1" (i=1, 2, . . . , M).

TABLE 1

| Value | Description |
|---|---|
| b0 | Next FP_TS (31 bits) may involve an FEC source or repair packet block of a one-stage FEC and LA-FEC encoding structure or an $i^{th}$ FEC source or repair packet block of a two-stage FEC encoding structure (M > 1 and i = 1, 2, . . . , M). |
| b1 | Next FP_TS (31 bits) may be intended for the FEC source or repair packet block of the two-stage FEC encoding structure. |

FP_TS (31 bits)—FP_TS indicates the other 31 bits except for the most significant bit (MSB) in a timestamp of 32 bits existing in a packet header of the first transmitted MMTP packet in a related FEC source/repair packet block.

According to another embodiment of the present disclosure, FFSRP_TS may selectively exist. For example, a signaling message delivered through a separate packet except for the FEC source/repair packet may include a flag indicating existence of FFSRP_TS.

A repair FEC payload ID of the FEC configuration information may exist after an MMTP packet header in the FEC repair packet like in the example of the FEC repair packet format shown in FIG. 13.

Figure 16:
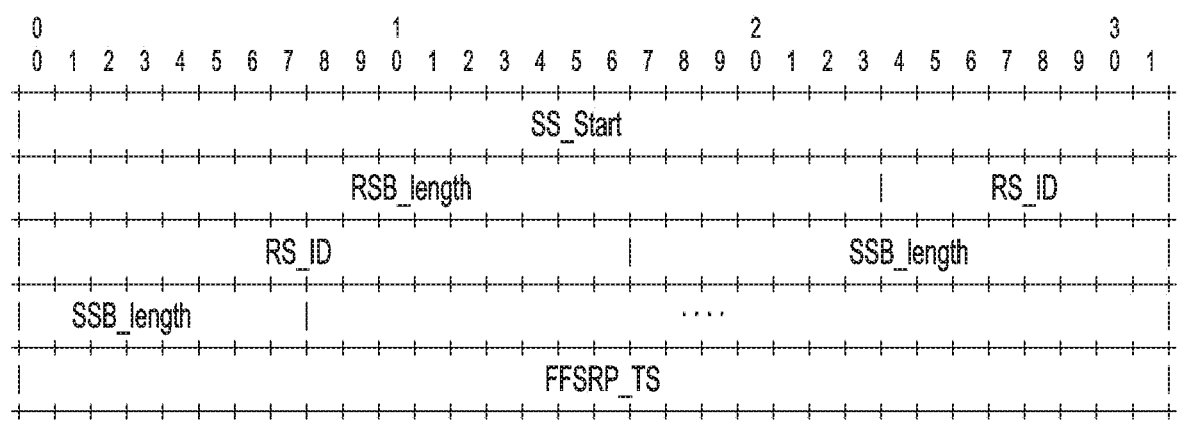
FIG. 16 illustrates an example of a repair FEC payload ID format, according to an embodiment of the present disclosure.

FIG. 16 illustrates an example of an FEC repair packet format, according to an embodiment of the present disclosure.

Referring to FIG. 16, the repair FEC payload ID format may include an SS_Start field, an RSB_length field, an RS_ID field, an SSB_length field, and an FFSRP_TS field, and an example of a usage of each field is as below.

SS_Start (32 bits)—indicates a boundary of a related source symbol block. When ssbg_mode0 or ssbg_mode1 is used, it may be set to a sequence number of the first source symbol of the related source symbol block. When ssbg_mode2 is used, it may be set to a sequence number of the first symbol element of the related source symbol block.

RSB_length (24 bits)—RSB_length indicates the number of repair symbols constituting a repair symbol block including the repair symbols transmitted through an FEC repair packet.

RS_ID (24 bits)—indicates a sequence number for identifying the first repair symbol included in the FEC repair packet. When the FEC repair packet includes two or more repair symbols, sequence numbers of repair symbols subsequent to the first repair symbol may increase one by one. For all the repair symbol blocks, the sequence number may start from 0 and increase one by one for each repair symbol.

SSB_length[N] (N*24 bits)—when the LA-FEC encoding structure is not used, N is "1", and SSB_length indicates the number of source symbols included in a related source symbol block (when ssbg_mode0 or ssbg_mode1 is used) or the number of source symbol elements included in the related source symbol block (except for a source symbol element including only padding when ssbg_mode2 is used). When the LA-FEC encoding structure is used, N is should be equal to the number of supplementary layers+1, and SSB_length[i] indicates the number of source symbols included in a related source symbol block of an $i^{th}$ flow (when ssbg_mode0 or ssbg_mode1 is used) or the number of source symbol elements included in the related source symbol block of the $i^{th}$ flow (except for a source symbol element including only padding when ssbg_mode2 is used). That is, SSB_length[N] indicates length information corresponding to each of source symbol sub-blocks.

FFSRP_TS (4 bytes)—includes TS_Indicator (1 bit) and subsequent FP_TS (31 bits).

TS_Indicator (1 bit)—indicates a timestamp in FEC (referring to TS_Indicator in Table 2). For one-stage FEC encoding structure and LA-FEC, a value of this field needs to be set to "0". For two-stage FEC encoding structure (M>1), when this field is set to "1", it may indicate that FP_TS (31 bits) is a value for an FEC source or repair packet block; for "0", it may indicate that next FP_TS (31 bits) is a value for an $i^{th}$ FEC source or repair packet block (M>1 and i=1, 2, . . . , M) of the two-stage FEC encoding structure. For two-stage FEC encoding structure (M>1), for an odd-numbered FEC source packet of the $i^{th}$ FEC source packet block, this field may be set to "0"; for an even-numbered FEC source packet of the $i^{th}$ FEC source packet block, this field may be set to "1" (i=1, 2, . . . , M).

TABLE 2

| Value | Description |
|---|---|
| b0 | Next FP_TS (31 bits) may involve an FEC source or repair packet block of a one-stage FEC and LA-FEC encoding structure or an $i^{th}$ FEC source or repair packet block of a two-stage FEC encoding structure (M > 1 and i = 1, 2, . . . , M). |
| b1 | Next FP_TS (31 bits) may be intended for the FEC source or repair packet block of the two-stage FEC encoding structure. |

FP_TS (31 bits)—FP_TS indicates the other 31 bits except for the MSB in a timestamp of 32 bits existing in a packet header of the first transmitted MMTP packet Next, a description will be made of a multimedia service system that supports all of the one-stage FEC scheme, the two-stage FEC scheme, the LA-FEC scheme, and the adaptive FEC scheme and selects one of them to protect an MMTP packet. In this case, required FEC configuration information is as below.

Identification information indicating an applied FEC scheme: the number of divided source symbol blocks for the two-stage FEC scheme, and additional information for the adaptive FEC scheme.

Identification information indicating an FEC code used in repair symbol generation: two FEC code identification information when the two-stage FEC scheme is used.

Identification information indicating a source symbol block generation scheme: the number of symbol elements constituting one symbol when ssbg_mode2 is used.

Byte wise length of repair symbol

Sequence number of source/repair symbol included in received FEC source/repair packet Additional information for the adaptive FEC scheme and information except for a sequence number of a source/repair symbol included in the received FEC source/repair packet are information having small change, and thus may be delivered in the form of an AL-FEC signaling message. On the other hand, the sequence number of the source/repair symbol included in the received FEC source/repair packet may be transmitted through a packet because the sequence number changes for each block/packet. The additional information for the adaptive FEC scheme may be delivered in various forms depending on an implementation scheme. In the following embodiment, a description will be made of a method for transmitting the additional information for the adaptive FEC scheme to the receiver on the assumption that the source FEC payload ID and the repair FEC payload ID are used.

Figure 17:
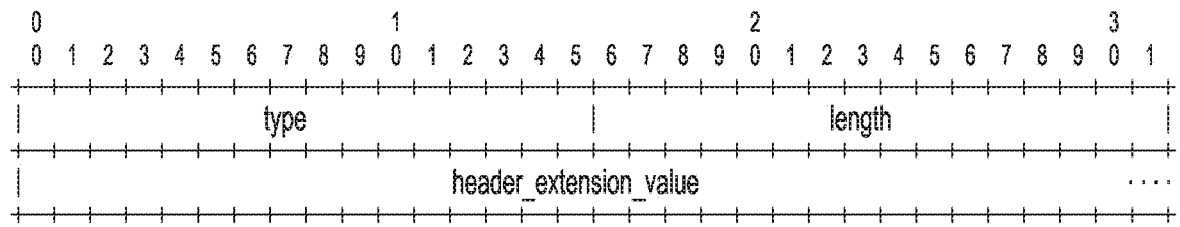
FIG. 17 illustrates a standard format of an extension header provided in a moving picture experts group (MPEG) media transport protocol (MMTP), according to an embodiment of the present disclosure.

FIG. 17 illustrates a standard format of an extension header provided in an MMTP, according to an embodiment of the present disclosure.

In the multimedia service system according to an embodiment of the present disclosure, the transmitter may configure information changing with each block/packet out of the additional information for the adaptive FEC scheme into a format shown in FIG. 17 and transmit the configured information to the transmitter.

Referring to FIG. 17, type indicates identification information for identifying header_extension_value, and length indicates a bytewise length of header_extension_value.

In this case, an extension header including the additional information for the adaptive FEC scheme may exist only in an FEC source or repair packet to which the adaptive FEC scheme is applied. Extension headers to be described with reference to FIGS. 18 through 22 may be included in all the FEC source packets or all the FEC repair packets to which the adaptive FEC scheme is applied, and may be included in all the FEC repair packets or only some of the FEC source/repair packets.

FIGS. 18 through 22 illustrate examples of an extension header format provided in an MMTP, according to an embodiment of the present disclosure.

Figure 18:
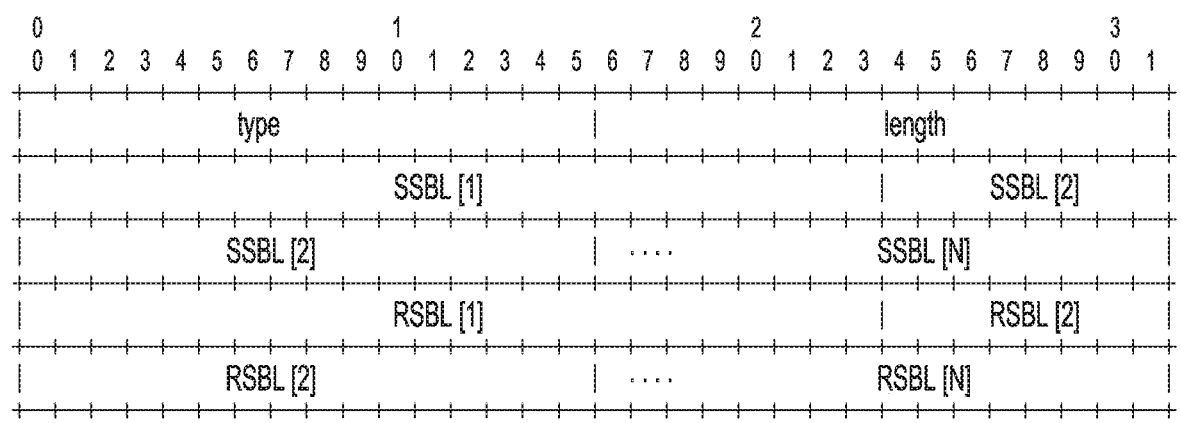
FIGS. 18, 19, 20, 21, and 22 illustrate examples of an extension header format provided in an MMTP, according to an embodiment of the present disclosure.

More specifically, when the adaptive FEC scheme according to an embodiment of the present disclosure is used, an AL-FEC message may include the number of source symbol sub-blocks, N, constituting a source symbol block. In this case, the number of symbols included in each source symbol sub-block and the number of symbols included in each repair symbol sub-block may be delivered to an extension header shown in FIG. 18. Referring to FIG. 18, the number of symbols included in each source symbol sub-block and the number of symbols included in each repair symbol sub-block may be delivered through 24-bit fields, respectively.

The extension header illustrated in FIG. 18 may include lengths of N source/repair symbol sub-blocks. However, a length of an $Nt^h$ source/repair symbol sub-block may be calculated using lengths of first through $(N-1)t^h$ source/repair symbol sub-blocks in the entire length of a source/repair block delivered through a repair FEC payload ID, and thus may be omitted from the extension header as illustrated in FIG. 19.

Figure 19:
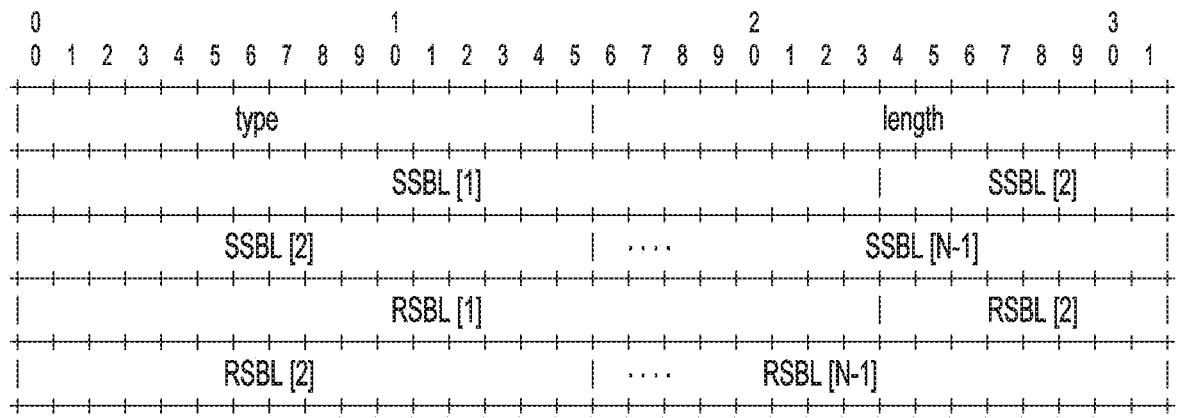

FIG. 19 illustrates another example of an extension header format provided in an MMTP according to an embodiment of the present disclosure, in which the length of the $N^{th}$ source/repair symbol sub-block is omitted.

Considering the restrictions of the FEC code, when repair symbols included in the $i^{th}$ repair symbol sub-block are received, the number of symbols included in each of the first through $i^{th}$ source/repair symbol sub-blocks is known, a lost symbol among source symbols included in each of the first through $i^{th}$ source symbol sub-blocks may be recovered by performing an inverse process with respect to FEC_algo#i( ). Thus, as shown in the format of the extension header of FIG. 20, an extension header including the number of symbols included in each of the first through $i^{th}$ source/repair symbol sub-blocks may be transmitted through all the FEC source/repair packets including a symbol included in the $i^{th}$ source/repair symbol sub-block, or all the FEC repair packets or some FEC source/repair packets. In this case, SSBL[k] and RSBL[k] (k=1, 2, . . . , i) have a fixed length (3 bytes), such that a value i may be known by dividing a value of a length field by 6 without separate signaling.

For FEC encoding according to another embodiment of the present disclosure, when repair symbols included in the $i^{th}$ repair symbol sub-block are received, the number of symbols included in each of the first through $i^{th}$ source symbol sub-blocks, a total number of repair symbols included in each of the first through $(i-1)^{th}$ repair symbol sub-blocks, and the number of symbols included in the $i^{th}$ repair symbol sub-block are known, a lost symbol among source symbols included in each of the first through $i^{th}$ source symbol sub-blocks may be recovered by performing an inverse process with respect to FEC_algo#i( ). Thus, as shown in the format of the extension header of FIG. 21, an extension header including the next field may be transmitted through all the FEC source/repair packets including a symbol included in the $i^{th}$ source/repair symbol sub-block, or all the FEC repair packets or some FEC source/repair packets.

RSB_start: identification information (RS_ID) of the first repair symbol included in the $i^{th}$ repair symbol sub-block. That is, a sum of repair symbols included in the first through $(i-1)^{th}$ repair symbol sub-blocks.

RSBL[i]: the number of repair symbols included in the $i^{th}$ repair symbol sub-block.

SSBL[j]: the number of source symbols included in a $j^{th}$ source symbol sub-block.

In this case, SSBL[k] (k=1, 2, . . . , i) has a fixed length (3 bytes), such that a value i may be known by dividing (a value of a length field–6) by 3 without separate signaling.

Figure 20:
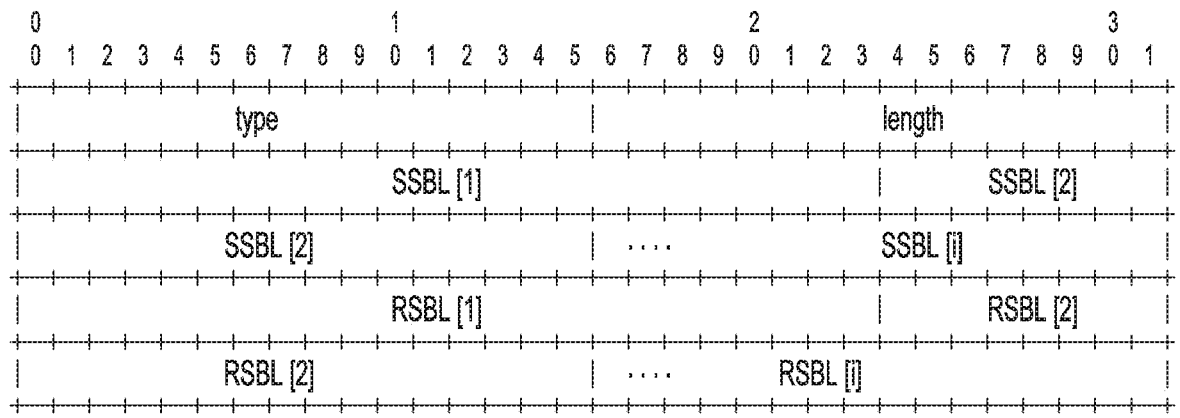
Figure 21:
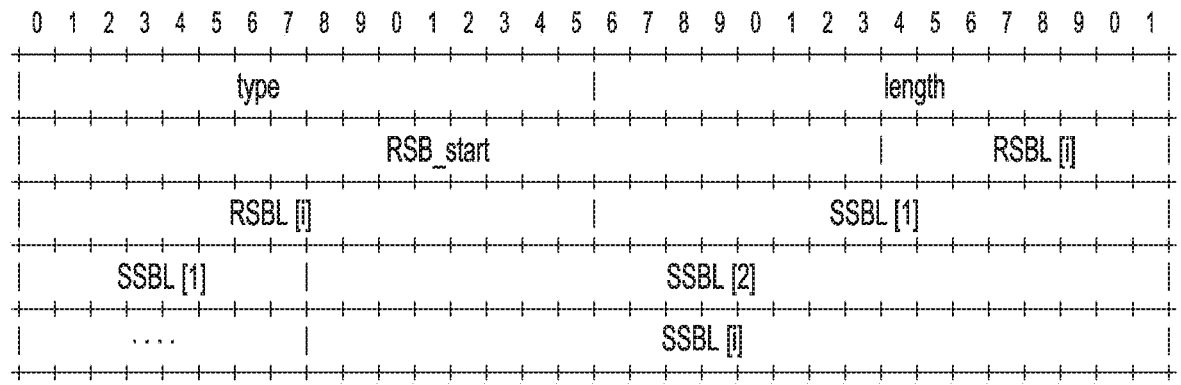

The above-described embodiments consider a case where lengths of source/repair symbol sub-blocks are included in an extension header. In another embodiment, the lengths of repair symbol sub-blocks are transmitted through a repair FEC payload ID, and the length of the source symbol sub-block may be signaled through the extension header. In this case, the extension header may have a format in which an RSBL existing in a rear portion of the format of the extension header shown in FIGS. 18, 19, and 20 is omitted. In another embodiment, the lengths of source symbol sub-blocks are transmitted through a repair FEC payload ID, and the length of the repair symbol sub-block may be signaled through the extension header. In this case, the extension header may have a format in which an SSBL existing in a front portion of the format of the extension header shown in FIGS. 18, 19, 20, and 21 is omitted. In the embodiment shown in FIG. 18, when SSBL[k] (k=1, 2, . . . , i) is omitted, the value i may be known by dividing the value of the length field by 3 without separate signaling. An example of an MMTP packet header extension for signaling SSBL through the FEC payload ID in the format of the extension header shown in FIG. 21 is shown in FIG. 22.

Figure 22:
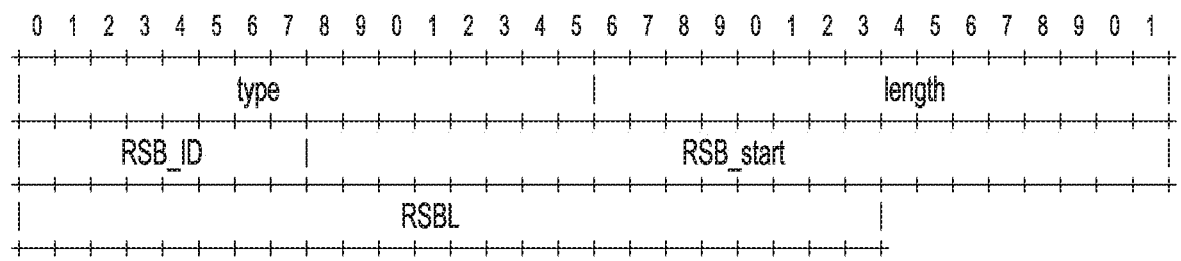

In FIG. 22, RSB_ID may indicate identification information i corresponding to each of repair symbol sub-blocks included in a current MMTP packet, RSB_start may indicate identification information RS_ID of the first repair symbol among repair symbols included in the $i^{th}$ repair symbol sub-block (i.e., a sum of repair symbols included in the first through $(i-1)^{th}$ repair symbol sub-blocks), and RSBL may indicate the number of repair symbols included in the $i^{th}$ repair symbol sub-block. In another embodiment of the present disclosure, the RSBL field of FIG. 22 may be omitted.

Figure 23:
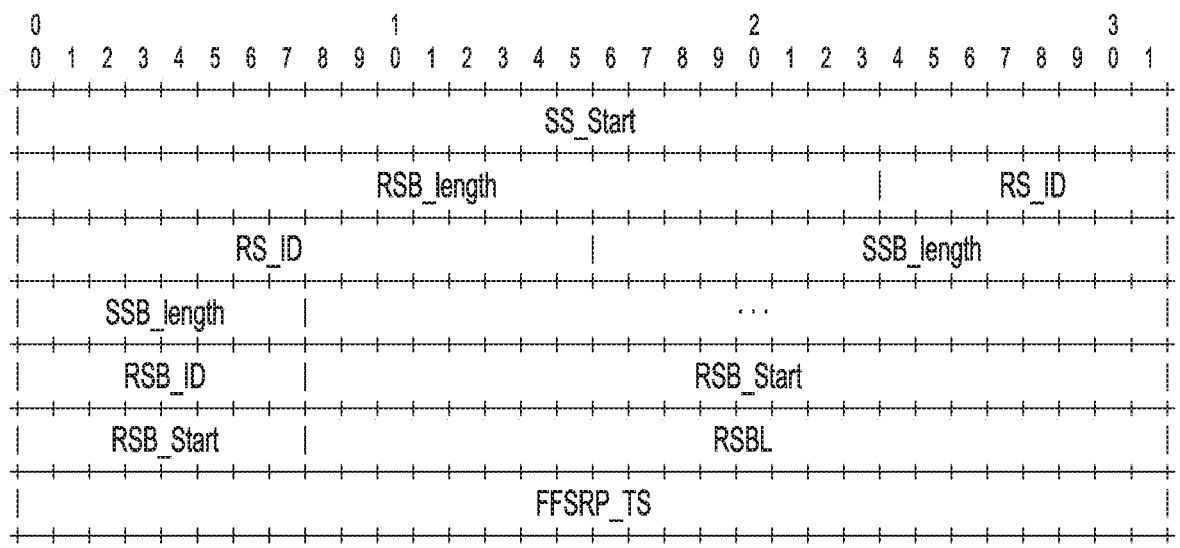
FIG. 23 illustrates another example of an FEC repair packet format, according to an embodiment of the present disclosure.

When fields included in the format of the extension header illustrated in FIG. 22 are transmitted in a repair FEC payload ID format, the repair FEC payload ID format may be expressed as shown in FIG. 23.

FIG. 23 illustrates another example of an FEC repair packet format, according to an embodiment of the present disclosure.

Referring to FIG. 23, the repair FEC payload ID format may include fields (i.e., an SSB_length [N] field, an RSB_ID field, an RSB_start field, and RSBL) included in the format of the extension header shown in FIG. 22.

More specifically, when the adaptive FEC scheme according to an embodiment of the present disclosure is used, an AL-FEC message may include the number of source symbol sub-blocks, N, constituting a source symbol block, and the length of each source/repair symbol sub-block. In this case, an embodiment of two types of an adaptive FEC scheme may be considered. The first scheme is updating an AL-FEC message every source packet block and transmitting the updated AL-FEC message to the receiver, in which case the above-described MMTP extension header is not used. The second scheme is delivering maximum lengths of respective source/repair symbol sub-blocks and using the maximum lengths as a parameter of the aforementioned FEC_algo#i. In this case, there may be one or more symbols composed of only padding bytes according to characteristics of multimedia data. Thus, in this case, it is necessary to deliver the number of symbols including data delivered from the source packet for each source symbol sub-block by using the extension header in the same format as the embodiments of the above-described MMTP extension header or the number of symbols composed of only padding bytes. When the number of symbols composed of only padding bytes is delivered, a value of SSBL[j] may be set to the number of source symbols composed of only padding bytes included in the $i^{th}$ source symbol sub-block and the set value may be signaled in the embodiments of FIGS. 18, 19, and 20. Hereinbelow, an overall method of transmitting and receiving a packet based on an AL-FEC scheme in a multimedia service system according to an embodiment of the present disclosure will be described with reference to FIGS. 24 and 25.

Figure 24:
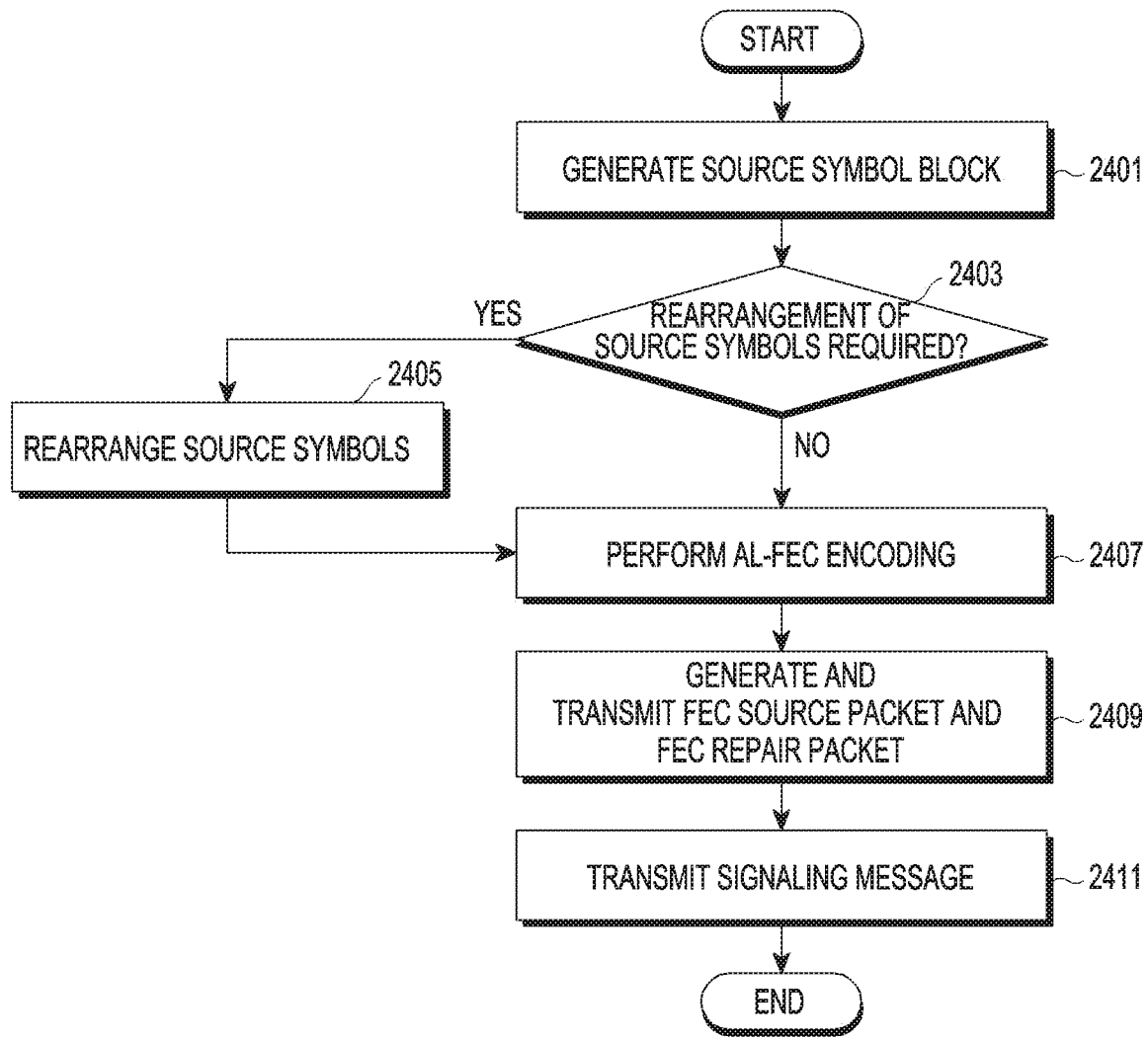
FIG. 24 illustrates an example of a method of transmitting a packet by using an AL-FEC scheme in a transmitter, according to an embodiment of the present disclosure.

FIG. 24 illustrates an example of a method of transmitting a packet by using an AL-FEC scheme in a transmitter, according to an embodiment of the present disclosure.

Referring to FIG. 24, the transmitter may generate a source symbol block from a source packet block based on FEC configuration information in operation 2401. The transmitter may receive the generated source symbol block and determine whether rearrangement of source symbols is required based on priorities of source packets in operation 2403. When determining that rearrangement of the source symbols in the generated source symbol block is required, the transmitter may perform rearrangement of the source symbols based on the priorities of the source packets in operation 2405. As the rearrangement is performed, the source symbol block may include multiple source symbol sub-blocks having different priorities and each of the multiple source symbol sub-blocks may include multiple source symbols. The priorities of the source symbols included in one of the multiple source symbol sub-blocks are different from the priorities of the source symbols included in another source symbol sub-block of the multiple source symbol sub-blocks, and the priorities of repair symbols included in a particular repair symbol sub-block generated from a particular source symbol sub-block as one of the source symbol sub-blocks may be determined by the priorities of source symbols included in the particular source symbol sub-block.

When determining that rearrangement of the source symbols in the generated source symbol block is not required or after performing rearrangement of the source symbols, the transmitter may perform AL-FEC encoding with respect to the source symbol block in operation 2407. In this case, the transmitter may perform AL-FEC encoding based on FEC configuration information, and in particular, when identification information indicating that an adaptive FEC scheme is used is included in FEC configuration information according to an embodiment of the present disclosure, AL-FEC encoding may be performed based on the adaptive FEC scheme. The transmitter may identify a source symbol block and a repair symbol block according to AL-FEC encoding, generate an FEC source packet and an FEC repair packet, and transmit them to the receiver in operation 2409. The transmitter may generate a signaling message including identification information indicating that an adaptive FEC scheme among the multiple FEC schemes is used and transmit the signaling message to the receiver in operation 2411. Herein, a configuration of the FEC source packet and a configuration of the FEC repair packet have already been described in detail with reference to FIGS. 12 through 23, and thus will not be described in detail at this time.

Figure 25:
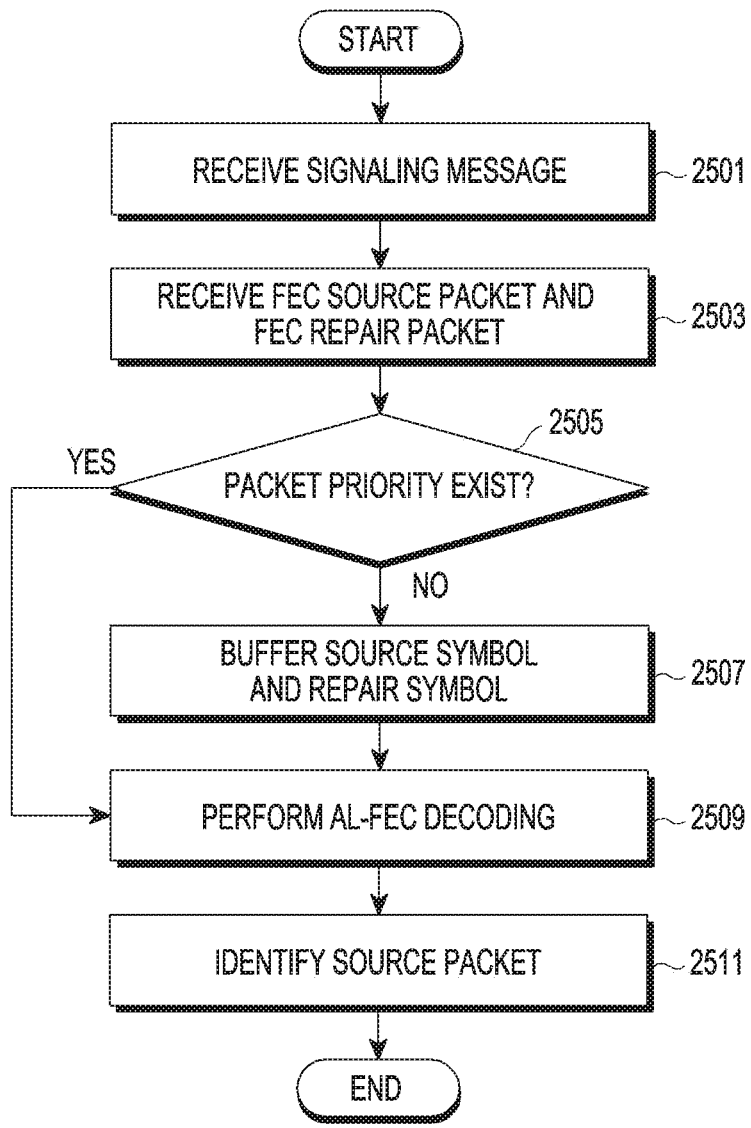
FIG. 25 illustrates an example of a method of receiving a packet by using an AL-FEC scheme in a receiver, according to an embodiment of the present disclosure.

FIG. 25 illustrates an example of a method of receiving a packet by using an AL-FEC scheme in a receiver, according to an embodiment of the present disclosure.

Referring to FIG. 25, the receiver may receive a signaling message including identification information indicating that an adaptive FEC scheme among the multiple FEC schemes is used in operation 2501. The receiver may receive an FEC source packet and an FEC repair packet from the transmitter in operation 2503, and determine whether a packet priority exists based on FEC configuration information for the received FEC source packet in operation 2505.

When the packet priority exists in the received FEC source packet, the receiver may buffer a source symbol and a repair symbol in operation 2507. When the packet priority does not exist in the received FEC source packet or buffering is completed, the receiver may decode an FEC source packet and an FEC repair packet based on the identification information included in the signaling message by using the adaptive FEC scheme in operation 2509. Thus, the receiver may identify a source packet based on the decoding in operation 2511.

While embodiments of the present disclosure have been described, various changes may be made without departing the scope of the present disclosure. Therefore, the scope of the present disclosure should be defined by the appended claims and equivalents thereof, rather than by the described embodiments.

The invention claimed is:

1. A method for transmitting a broadcast service by a transmitter, the method comprising:
    inputting a source symbol block comprising multiple source symbol sub-blocks having a number of different priorities;
    generating repair symbol sub-blocks corresponding to the multiple source symbol sub-blocks;
    transmitting the multiple source symbol sub-blocks and the repair symbol sub-blocks to a receiver;
    determining one forward error correction (FEC) scheme for a broadcast service among multiple FEC schemes;
    configuring a signaling message to include an identifier indicating the determined FEC scheme; and
    transmitting the configured signaling message,
    wherein the multiple FEC schemes comprise an adaptive FEC scheme,
    wherein the adaptive FEC scheme is applicable to a source flow divided into the source symbol block or multiple source symbol blocks, and the source symbol block or each of the multiple source symbol blocks divided from the source flow comprises the multiple source symbol sub-blocks having the number of different priorities,
    wherein priorities of source symbols included in one of the multiple source symbol sub-blocks are different from priorities of source symbols included in another source symbol sub-block of the multiple source symbol sub-blocks, and
    wherein priorities of repair symbols included in a repair symbol sub-block generated from one of the multiple source symbol sub-blocks are determined by the priorities of source symbols included in one of the multiple source symbol sub-blocks.

2. The method of claim 1, further comprising rearranging multiple packets included in a packet block with one of the multiple source symbol sub-blocks on a priority basis.

3. The method of claim 1, further comprising:
    generating configuration information comprising length information (SSB_length) corresponding to each of the multiple source symbol sub-blocks, identification information (RSB_ID) corresponding to each of the repair symbol sub-blocks, identification information (RSB_start) of a first repair symbol among the repair symbols included in each of the repair symbol sub-blocks, and a number of repair symbols (RSBL) included in each of the repair symbol sub-blocks; and
    transmitting the generated configuration information to the receiver.

4. The method of claim 3, wherein the configuration information is transmitted to the receiver through a header of a repair packet transmitting the repair symbol sub-blocks or through the signaling message.

5. A method for receiving a broadcast service by a receiver, the method comprising:
    receiving a signaling message from a transmitter;
    identifying an identifier indicating one forward error correction (FEC) scheme for a broadcast service among multiple FEC schemes, the identifier being included in the signaling message;
    receiving a source symbol block and a repair symbol block;
    identifying multiple source symbol sub-blocks having a number of different priorities included in the source symbol block; and
    identifying repair sub-blocks corresponding to the multiple source symbol sub-blocks included in the repair symbol block,
    wherein the multiple FEC schemes comprise an adaptive FEC scheme,
    wherein the adaptive FEC scheme is applicable to a source flow divided into the source symbol block or multiple source symbol blocks, and the source symbol block or each of the multiple source symbol blocks divided from the source flow comprises the multiple source symbol sub-blocks having the number of different priorities,
    wherein priorities of source symbols included in one of the multiple source symbol sub-blocks are different from priorities of source symbols included in another source symbol sub-block of the multiple source symbol sub-blocks, and
    wherein priorities of repair symbols included in a repair symbol sub-block generated from one of the multiple source symbol sub-blocks are determined by the priorities of source symbols included in one of the multiple source symbol sub-blocks.

6. The method of claim 5, wherein multiple packets included in a packet block are rearranged with one of the multiple source symbol sub-blocks on a priority basis.

7. The method of claim 5, further comprising receiving configuration information comprising length information (SSB_length) corresponding to each of the multiple source symbol sub-blocks, identification information (RSB_ID) corresponding to each of the repair symbol sub-blocks, identification information (RSB_start) of a first repair symbol among the repair symbols included in each of the repair symbol sub-blocks, and a number of repair symbols (RSBL) included in each of the repair symbol sub-blocks.

8. The method of claim 7, wherein the configuration information is received through a header of a repair packet transmitting the repair sub-blocks or through the signaling message.

9. A transmitter for transmitting a broadcast service, the transmitter comprising:
  at least one processor configured to:
    input a source symbol block comprising multiple source symbol sub-blocks having a number of different priorities,
    generate repair symbol sub-blocks corresponding to the multiple source symbol sub-blocks,
    determine one forward error correction (FEC) scheme for a broadcast service among multiple FEC schemes, and
    configure a signaling message to include an identifier indicating the determined FEC scheme; and
  a transceiver configured to transmit the configured signaling message and transmit the multiple source symbol sub-blocks and the repair symbol sub-blocks to a receiver,
  wherein the multiple FEC schemes comprise an adaptive FEC scheme,
  wherein the adaptive FEC scheme is applicable to a source flow divided into the source symbol block or multiple source symbol blocks, and the source symbol block or each of the multiple source symbol blocks divided from the source flow comprises the multiple source symbol sub-blocks having the number of different priorities,
  wherein priorities of source symbols included in one of the multiple source symbol sub-blocks are different from priorities of source symbols included in another source symbol sub-block of the multiple source symbol sub-blocks, and
  wherein priorities of repair symbols included in a repair symbol sub-block generated from one of the multiple source symbol sub-blocks are determined by the priorities of source symbols included in one of the multiple source symbol sub-blocks.

10. The transmitter of claim 9, wherein the at least one processor is further configured to:
  rearrange multiple packets included in a packet block with one of the multiple source symbol sub-blocks on a priority basis.

11. The transmitter of claim 9, wherein the at least one processor is further configured to:
  generate configuration information comprising length information (SSB_length) corresponding to each of the multiple source symbol sub-blocks, identification information (RSB_ID) corresponding to each of the repair symbol sub-blocks, identification information (RSB_start) of a first repair symbol among the repair symbols included in each of the repair symbol sub-blocks, and a number of repair symbols (RSBL) included in each of the repair symbol sub-blocks, and
  control to transmit the generated configuration information to the receiver.

12. The transmitter of claim 11, wherein the configuration information is transmitted to the receiver through a header of a repair packet transmitting the repair symbol sub-blocks or through the signaling message.

13. A receiver for receiving a broadcast service, the receiver comprising:
  a transceiver configured to:
    receive a signaling message from a transmitter, and
    receive a source symbol block and a repair symbol block; and
  at least one processor configured to:
    identify an identifier indicating one forward error correction (FEC) scheme for a broadcast service among multiple FEC schemes, the identifier being included in the signaling message,
    identify multiple source symbol sub-blocks having a number of different priorities included in the source symbol block, and
    identify repair sub-blocks corresponding to the multiple source symbol sub-blocks included in the repair symbol block,
  wherein the multiple FEC schemes comprise an adaptive FEC scheme,
  wherein the adaptive FEC scheme is applicable to a source flow divided into the source symbol block or multiple source symbol blocks, and the source symbol block or each of the multiple source symbol blocks divided from the source flow comprises the multiple source symbol sub-blocks having the number of different priorities,
  wherein priorities of source symbols included in one of the multiple source symbol sub-blocks are different from priorities of source symbols included in another source symbol sub-block of the multiple source symbol sub-blocks, and
  wherein priorities of repair symbols included in a repair symbol sub-block generated from one of the multiple source symbol sub-blocks are determined by the priorities of source symbols included in one of the multiple source symbol sub-blocks.

14. The receiver of claim 13, wherein multiple packets included in a packet block are rearranged with one of the multiple source symbol sub-blocks on a priority basis.

15. The receiver of claim 13, wherein the at least one processor is further configured to control receive configuration information comprising length information (SSB_length) corresponding to each of the multiple source symbol sub-blocks, identification information (RSB_ID) corresponding to each of the repair symbol sub-blocks, identification information (RSB_start) of a first repair symbol among the repair symbols included in each of the repair symbol sub-blocks, and a number of repair symbols (RSBL) included in each of the repair symbol sub-blocks.

16. The receiver of claim 15, wherein the configuration information is received through a header of a repair packet transmitting the repair sub-blocks or through the signaling message.

17. The method of claim 1, wherein the number of different priorities comprises a priority for each asset in a bundle or each bundle in bundle delivery characteristics.

* * * * *